United States Patent [19]
Naritake

[11] Patent Number: 5,978,255
[45] Date of Patent: Nov. 2, 1999

[54] SEMICONDUCTOR MEMORY DEVICE STABLY STORING MULTIPLE-VALUED DATA WITHOUT A DECREASE IN OPERATION MARGIN

[75] Inventor: Isao Naritake, Tokyo, Japan

[73] Assignee: NEC Corporation, Tokyo, Japan

[21] Appl. No.: 09/157,365

[22] Filed: Sep. 21, 1998

[30] Foreign Application Priority Data

Sep. 22, 1997 [JP] Japan .................................... 9-256625

[51] Int. Cl.[6] .................................................. G11C 11/24
[52] U.S. Cl. .......................... 365/149; 365/168; 365/210; 365/230.03
[58] Field of Search .................................... 365/149, 168, 365/210, 230.03

[56] References Cited

U.S. PATENT DOCUMENTS 5,771,187   6/1998   Kapoor ..................................... 365/149

FOREIGN PATENT DOCUMENTS 8-352635   12/1996   Japan .
9-320280   12/1997   Japan .

*Primary Examiner*—Andrew Q. Tran
*Attorney, Agent, or Firm*—McGinn & Gibb, P.C.

[57] ABSTRACT

A semiconductor dynamic random access memory device has memory cells each storing a piece of multiple-valued data equivalent to two-bit binary data in the form of electric charge, and sub-bit line pairs selectively connected to the memory cells use parasitic capacitors coupled thereto as charge accumulators weighted by two, wherein the piece of multiple-valued data transferred from the sub-bit line pair to a main bit line pair supplies a first potential level to one of the charge accumulators assigned to the most significant bit and a second potential level to another of the charge accumulators assigned to the least significant bit, and dummy cells are selectively coupled to the charge accumulators so as to make storage capacitance coupled to the charge accumulator assigned to the most significant bit twice as large as the storage capacitance coupled to the charge accumulator assigned to the least significant bit, thereby eliminating electrical influence of the storage capacitor of the selected memory cell from a restore level.

16 Claims, 14 Drawing Sheets

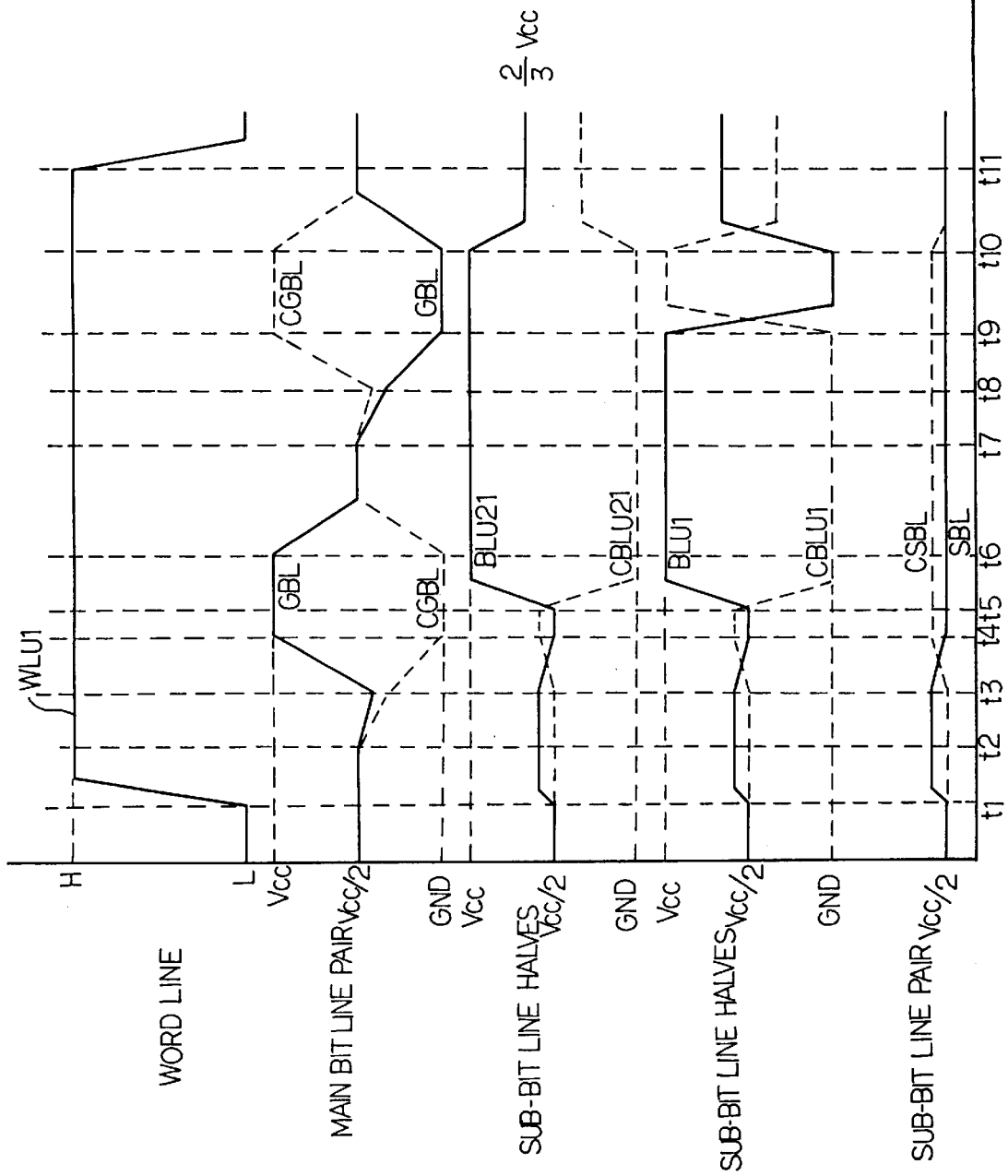

SEMICONDUCTOR MEMORY DEVICE STABLY STORING MULTIPLE-VALUED DATA WITHOUT A DECREASE IN OPERATION MARGIN

FIELD OF THE INVENTION

This invention relates to a semiconductor memory device and, more particularly, to a semiconductor dynamic random access memory device having a memory cell for storing pieces of multiple-valued data.

DESCRIPTION OF THE RELATED ART

An example of the semiconductor dynamic random access memory device is disclosed in Japanese Patent Application No. 8-352635 filed on Dec. 13, 1996, and the Japanese Patent Application had not been published before Sep. 22, 1997. FIG. 1 illustrates the semiconductor dynamic random access memory device. The semiconductor dynamic random access memory device four memory cell arrays 1a/1b/1c/1d. The memory cell arrays 1a/1b and the memory cell arrays 1c/1d are respectively associated with a sub-bit line BLL/CBLL and a sub-bit line BLU/CBLU, and a sub-bit line pair SBL/CSBL is shared between the memory cell arrays 1a/1b and the memory cell arrays 1c/1d. The memory cell arrays 1a/1b/1c/1d are further associated with a main bit line pair GBL/CGBL.

Plural memory cells MC1a, MC2a, . . . MC3a and MC4a are incorporated in the memory cell array 1a, and each of the memory cells MC1a–MC4a is implemented by a series combination of an n-channel enhancement type access transistor TR1 and a storage capacitor CP1. The storage capacitor CP1 has capacitance Cs. The series combination is connected between one BLL of the bit lines BLL/CBLL and a cell plate line HVCIP, and another series combination is connected between the other bit line CBLL and the cell plate line HVCIP. The cell plate line HVCIP is fixed to a half Vcc/2 of the positive power voltage level. The memory cell array 1a is further associated with plural word lines WLL1, WLL2 . . . WLLn–1 and WLLn, and the word lines WLL1–WLLn are selectively connected to the gate electrodes of the n-channel enhancement type access transistors of the rows of memory cells MC1a/MC2a . . . and MC3a/MC4a. Each of the memory cells MC1a–MC4a stores a piece of data having a quaternary value. Vcc and GND are assumed to represent a positive power voltage and a ground level, respectively. The potential level at the storage node of the capacitor CP1 has a potential level Vcc, 2 Vcc/3, Vcc/3 or GND, and the four potential level Vcc, 2 Vcc/3, Vcc/3 and GND are corresponding to a binary value "11", "10", "01" and "00", respectively.

The other memory cells of the arrays 1b/1c/1d are labeled with MC1b/MC2b/MC3b/MC4b, MC1c/MC2c/MC3c/MC4c and MC1d/MC2d/MC3d/MC4d, respectively, and the word lines associated with the memory cell arrays 1b/1c/1d are labeled with WLLn+1/WLLn+2, . . . /WLL2n–1/WLL2n, WLU1/WLU2/ . . . WLUn–1/WLUn and WLUn+1/WLUn+2 . . . /WLU2n–1/WLU2n. The other memory cell arrays 1b/1c/1d and the associated word lines WLLn+1–WLL2n/WLU1–WLUn/WLUn+1–WLU2n are arranged as similar to the memory cell array 1a and the associated word lines WLL1–WLLn, and, for this reason, detailed description is omitted hereinbelow.

The semiconductor dynamic random access memory device further comprises transfer gate arrays 2a/2b/ 2c/2d. The transfer gate array 2a is inserted into the sub-bit line pair BLL/CBLL, and splits the sub-bit line pair into sub-bit line portions BLL1/CBLL1 and BLL2/CBLL2. The transfer gate array 2a is implemented by n-channel enhancement type switching transistors SW1, and the n-channel enhancement type switching transistors SW1 are gated by a transfer gate control line CTGL. The transfer gate array 2a electrically connects the sub-bit line pair BLL1/CBLL1 to and isolates them from the sub-bit line pair BLL2/CBLL2.

The transfer gate array 2b is inserted between the sub-bit line pair BLL/CBLL and the sub-bit line pair SBL/CSBL, and is implemented by n-channel enhancement type switching transistors SW2. A transfer gate control line TGL is connected to the gate electrodes of the n-channel enhancement type switching transistors SW2, and the sub-bit line pair SBL/CSBL is electrically connected to and isolated from the sub-bit line pair BLL/CBLL.

The transfer gate array 2c is inserted between the sub-bit line pair BLU/CBLU and the sub-bit line pair SBL/CSBL, and is implemented by n-channel enhancement type switching transistors SW3. A transfer gate control line TGU is connected to the gate electrodes of the n-channel enhancement type switching transistors SW3, and the sub-bit line pair SBL/CSBL is electrically connected to and isolated from the sub-bit line pair BLU/CBLU.

The transfer gate array 2d is inserted into the sub-bit line pair BLU/CBLU, and splits the sub-bit line pair into sub-bit line portions BLU1/CBLU1 and BLU2/CBLU2. The transfer gate array 2d is implemented by n-channel enhancement type switching transistors SW4, and the n-channel enhancement type switching transistors SW4 are gated by a transfer gate control line CTGU. The transfer gate array 2d electrically connects the sub-bit line portions BLU1/CBLU1 to and isolates them from the sub-bit line portions BLU2/CBLU2. In this instance, parasitic capacitance Cb is coupled to each sub-bit line portions BLL1/CBLL1, BLL2/CBLL2, BLU1/CBLU1 or BLU2/CBLU2 due to n word lines, and parasitic capacitance Ca is coupled to the sub-bit line pair SBL/CSBL.

The semiconductor dynamic random access memory device further comprises a precharging circuit 3, a read-out circuit 4 and a sub-sense amplifier 5. The precharging circuit 3 charges and equalizes the sub-bit line pairs BLL/CBLL, SBL/CSBL and BLU/CBLU, and is implemented by n-channel enhancement type switching transistors SW5. Two of the n-channel enhancement type switching transistors SW5 are connected between a potential line HVCD and the sub-bit lines SBL/CSBL, and the third n-channel enhancement type field effect transistor SW5 is connected between the sub-bit lines SBL and CSBL. The potential line HVCD supplies a precharge level Vcc/2 through the n-channel enhancement type switching transistors SW5 to the sub-bit lines SBL/CSBL. The n-channel enhancement type switching transistors SW5 are concurrently gated by a precharge control line PDL, and adjusts the sub-bit lines SBL/CSBL to precharge level Vcc/2.

The read-out circuit 4 includes a series combination of an n-channel enhancement type switching transistor SW6 and a capacitor CP2 connected between the sub-bit line SBL and the main bit line CGBL and another series combination of an n-channel enhancement type switching transistor SW6 and a capacitor CP2 connected between the sub-bit line CSBL and the main bit line GBL, and the n-channel enhancement type switching transistors SW6 are gated by a read-out control line CPE. The read-out circuit 4 converts a piece of data read out from a memory cell between a potential difference on the sub-bit line pair SBL/CSBL and another potential difference on the main bit line pair GBL/CGBL.

The sub-sense amplifier 5 includes a series combination of n-channel enhancement type field effect transistors SW7/SW8 connected between the main bit line CGBL and a ground line GND and another series combination of n-channel enhancement type field effect transistors SW9/SW10 connected between the main bit line GBL and the ground line GND. The n-channel enhancement type field effect transistors SW7/SW9 are gated by a read switch control line RS, and the other n-channel enhancement type field effect transistors SW8/SW10 are respectively gated by the sub-bit lines SBL/CSBL. The sub-sense amplifier 5 is activated by the read switch control line RS, and is responsive to the potential difference on the sub-bit line pair SBL/CSBL for increasing the magnitude of the potential difference on the main bit line GBL/CGBL.

The semiconductor dynamic random access memory device further comprises write-in circuits 6/7. The write-in circuit 6 is implemented by n-channel enhancement type switching transistors SW11, and the n-channel enhancement type switching transistors SW11 are connected between the sub-bit line pair BLL/CBLL and the main bit line pair GBL/CGBL. The n-channel enhancement type switching transistors SW11 are gated by a write switch control line WSL, and the potential difference on the main bit line pair GBL/CGBL is transferred to the sub-bit line pair BLL/CBLL. The other write-in circuit 7 is also implemented by n-channel enhancement type switching transistors SW12, and the n-channel enhancement type switching transistors SW12 are connected between the sub-bit line pair BLU/CBLU and the main bit line pair GBL/CGBL. The n-channel enhancement type switching transistors SW12 are gated by a write switch control line WSU, and the potential difference on the main bit line pair GBL/CGBL is transferred to the sub-bit line pair BLU/CBLU.

The semiconductor dynamic random access memory device further comprises a precharging circuit (not shown) connected to the main bit line pair GBL/CGBL and a main sense amplifier 8 also connected to the main bit line pair GBL/CGBL. The precharging circuit (not shown) charges the main bit line pair GBL/CGBL to the precharge level Vcc/2, and balances the main bit lines GBL/CGBL with each other. The main sense amplifier 8 increases the magnitude of potential difference on the main bit lines GBL/CGBL.

The semiconductor dynamic random access memory device behaves as follows. In the following description, the memory cell MC1d is assumed to be selected from the memory cell array 1d. The precharge control signal PDL is at the active high level, and all the transfer gate control lines TGU/CTGU/TGL/CTGL are also in the active high level. For this reason, the n-channel enhancement type switching transistors SW1 to SW5 are turned on so as to balance the sub-bit lines BLL/BLU/SBL/CBLL/CSBL/CBLU at a precharge level Vcc/2. The precharging circuit (not shown) also equalizes the main bit lines GBL and CGBL at the precharge level Vcc/2.

The precharge control line PDL is changed to the inactive low level at time t0, and the n-channel enhancement type switching transistors SW5 turn off so as to electrically isolate the sub-bit lines SBL/CSBL from the potential line HVCD. The sub-bit lines BLU/CBLU/SBL/CSBL/BLL/CBLL maintain the precharge level Vcc/2.

The transfer gate control lines TGL/CTGL are also changed to the inactive low level at time t0, and the n-channel enhancement type switching transistors SW1/SW2 turn off. Then, the sub-bit lines SBL/CSBL are electrically disconnected from the sub-bit lines BLL/CBLL, and the sub-bit line portions BLL1/CBLL1 and BLL2/CBLL2 are electrically isolated from one another. However, the transfer gate control lines TGU/CTGU are maintained at the active high level, and the sub-bit line portions BLU1/CBLU1 and BLU2/CBLU2 are still electrically connected to the sub-bit lines SBL/CSBL.

The word line WLU2n-1 is changed to the active high level at time t1, and causes the n-channel enhancement type access transistor TR1 of the memory cell MC1d to turn on. Then, the storage capacitor CP1 is connected through the n-channel enhancement type access transistor TR1 to the sub-bit line portion BLU2, and the piece of data stored therein changes the potential level on the sub-bit line portion BLU2. As described hereinbefore, the piece of data bit is represented by a potential level Vcc, 2 Vcc/3, Vcc/3 or GND at the storage node electrode, and the four potential levels are corresponding to the binary value "11", "10", "01" and "00", respectively. If the piece of data stored in the memory cell MC1d has the quaternary value equivalent to the binary value "10", the waveforms on the signal lines are shown in FIG. 3.

If the piece of data has the quaternary value equivalent to the binary value "11", the piece of data creates a potential difference $\Delta V$ between the sub-bit lines BLU and CBLU. The memory cell MC1d stores the piece of data equivalent to the binary value "10", and the potential difference created on the sub-bit lines BLU/CBLU is a third of the potential difference, i.e., $\Delta V/3$ (see FIG. 3). The potential difference $\Delta V/3$ is propagated from the sub-bit line portions BLU2/CBLU2 through the sub-bit line portions BLU1/CBLU1 to the sub-bit line pair SBL/CSBL.

The read switch control line RS is changed to the active high level at time t2 (see FIG. 2), and the n-channel enhancement type switching transistors SW7/SW9 turn on so as to activate the sub-sense amplifier 5. The potential difference $\Delta V/3$ on the sub-bit line pair SBL/CSBL makes the channel conductance of the n-channel enhancement type switching transistors SW8 larger than the channel conductance of the other n-channel enhancement type switching transistor SW10. As a result, the potential level on the main bit line CGBL is dropped from the precharge level wider than that on the other main bit line GBL (see FIG. 3). Thus, a potential difference is created on the main bit lines GBL/CGBL, and the piece of data represented by the potential difference $\Delta V/3$ is transferred to the main bit line pair GBL/CGBL.

The read switch control line RS is changed to the low level at time t3 (see FIG. 2), and the n-channel enhancement type switching transistors SW7/SW9 turn off. Then, the main bit line pair GBL/CGBL is electrically isolated from the sub-bit line pair SBL/CSBL. The main sense amplifier 8 is activated, and increases the magnitude of the potential difference on the main bit line pair GBL/CGBL. The main bit line GBL reaches the positive power voltage level Vcc, and the other main bit line CGBL goes down to the ground level GND (see FIG. 3). The positive power voltage level Vcc on the main bit line GBL is indicative of the high order bit "1" of the binary number "10".

While the main sense amplifier 8 is amplifying the potential difference on the main bit line pair GBL/CGBL, i.e., time t3 to time t4, the read-out control line CPE is held at the active high level (see FIG. 2), and the n-channel enhancement type switching transistors SW6 are turned on. For this reason, the potential variation on the main bit line pair GBL/CGBL affects the potential levels on the sub-bit lines SBL/CSBL through the n-channel enhancement type switching transistors SW6. As a result, the potential difference on the sub-bit line pair SBL/CSBL is varied as shown in FIG. 3. The potential difference on the main bit line pair GBL/CGBL represents the piece of data equivalent to the binary value "10", and the capacitors CP2 cause the sub-bit lines SBL and CSBL to go up by $\Delta V/3$ and go down by $\Delta V/3$. As a result, the potential level on the sub-bit line SBL becomes higher than the potential level on the other sub-bit line CSBL, and the plots indicative of the potential level on the sub-bit lines SBL crosses the plots indicative of the potential level on the other sub-bit line CSBL between time t3 and time t4 (see FIG. 3). The potential difference is transferred from the sub-bit line pair SBL/CSBL to the sub-bit line pair BLU/CBLU. For this reason, plots indicative of the potential level on the sub-bit line BLU crosses the plots indicative of the potential level on the other sub-bit line CBLU.

The read-out control line CPE and the transfer gate control line TGU are changed to the inactive low level at time t4 (see FIG. 2). The n-channel enhancement type switching transistors SW6 turn off, and the sub-bit line pair SBL/CSBL is released from the electrical influence of the main bit line pair GBL/CGBL. Moreover, the n-channel enhancement type switching transistors SW3 turn off, and the sub-bit line pair BLU/CBLU is electrically disconnected from the sub-bit line pair SBL/CSBL.

The write switch control line WSU is changed to the active high level at time t5 (see FIG. 2), and the n-channel enhancement type switching transistors SW12 turn on. Then, the large potential difference on the main bit line pair GBL/CGBL is transferred through the n-channel enhancement type switching transistors SW12 to the sub-bit line pair BLU/CBLU, and the potential levels on the sub-bit lines BLU/CBLU are changed to the positive power voltage Vcc and the ground level GND (see FIG. 3).

The write switch control line WSU is changed to the inactive low level at time t6, and the n-channel enhancement type switching transistors SW12 turn off. Then, the sub-bit line pair BLU/CBLU is electrically isolated from the main bit line pair GBL/CGBL. Though not shown in the drawings, the main bit line pair GBL/CGBL is charged to the precharge level Vcc/2. Thus, the high order bit "1" is read out from the sub-bit line pair BLU/CBLU to the main bit line pair SBL/CSBL between time t2 to time t6.

Subsequently, the low order bit "0" of the binary number "10" is read out from the sub-bit line pair SBL/CSBL to the main bit line pair GBL/CGBL as follows. The read switch control line RS is changed to the active high level at time t7 (see FIG. 2), again, and the n-channel enhancement type switching transistors SW7/SW9 turn on so as to activate the sub-sense amplifier 5. The potential levels on the sub-bit lines SBL/CSBL are inverted between time t2 and time t7 (see FIG. 3), and make the channel conductance of the n-channel enhancement type switching transistor SW10 larger than the channel conductance of the n-channel enhancement type switching transistor SW8. For this reason, the potential level on the main bit line GBL is widely decayed rather than the potential level on the other main bit line CGBL.

The read switch control line RS is recovered to the inactive low level at time t8, and the main sense amplifier 8 is activated. The main sense amplifier 8 increases the magnitude of the potential difference on the main bit line pair GBL/CGBL, and the main bit line CGBL and the main bit line GBL reach the positive power voltage level Vcc and the ground level GND, respectively. The ground level on the main bit line GBL is indicative of the low order bit "0" of the binary value "10". Thus, the high order bit "1" and the low order bit "0" are successively read out from the sub-bit line pair SBL/CSBL to the main bit line pair GBL/CGBL.

The write switch control line WSL and the transfer gate control line TGL are changed to the active high level at time t9 (see FIG. 2). The transfer gate control line TGL causes the n-channel enhancement type switching transistors SW2 to turn on so as to electrically connect the sub-bit line portions BLL2/CBLL2 to the sub-bit line pair SBL/CSBL. The write switch control line WSL causes the n-channel enhancement type switching transistors SW11 to turn on, and the large potential difference is transferred from the main bit line pair GBL/CGBL through the sub-bit line portions BLL2/CBLL2 to the sub-bit line pair SBL/CSBL. Thus, the sub-bit lines SBL/CSBL are changed to the ground level GND and the positive power voltage level Vcc, respectively. However, the transfer gate control line TGU keeps the n-channel enhancement type switching transistors SW3 off, and the sub-bit line pair BLU/CBLU is isolated from the sub-bit line pair SBL/CSBL.

The transfer gate control line TGU is changed to the active high level at time t10, and the n-channel enhancement type switching transistors SW3 turn on so as to electrically connect the sub-bit line pair SBL/CSBL to the sub-bit line pair BLU/CBLU. Then, the sub-bit line portions BLL2/CBLL2 and the sub-bit line pair SBL/CSBL are electrically connected to the sub-bit line pair BLU/CBLU through the transfer gate arrays 2b to 2d, and the potential level Vcp1 at the storage node electrode of the memory cell MC1d is given by equation 1.

$$Vcp1 = \{(2Cb + Cs) \cdot Vcc + (Cb + Ca) \cdot 0[V]\} / (3Cb + Ca + Cs)$$
$$= (2Cb, Cs) \cdot Vcc / (3Cb + Ca + Cs)$$

equation 1

The capacitance Cs and the parasitic capacitance Ca is much smaller than the parasitic capacitance Cb. Then, the potential level Vcp1 is equal to 2 Vcc/3, and the piece of data is restored in the memory cell MC1d.

Finally, the word line WLU2n−1 is changed to the inactive low level at time t11, and the n-channel enhancement type access transistor TR1 of the memory cell MC1d turns off so as to isolate the storage node electrode of the capacitor CP1 from the sub-bit line BLU.

When a memory cell is selected from the memory cell arrays 1c/1d, the transfer gate control line CTGU is fixed to the high level, and the transfer gate control line CTGL is changed from the high level to the low level at time t0, and is recovered to the high level at time t12. On the other hand, when a memory cell is selected from the memory cell arrays 1a/1b, the transfer gate control line CTGL is fixed to the high level, and the transfer gate control line CTGU is changed from the high level to the low level at time t0, and is recovered to the high level at time t12.

When the piece of data has another quaternary value, the potential levels on the sub-bit lines and the sub-bit line portions are varied as shown in table 1.

TABLE 1

| Binary | Before t10 | | After t10 |
|---|---|---|---|
| Value | BLU1, BLU2 | SBL, BLL2 | BLU1, BLU2, SBL, BLL2 |
| "11" | Vcc | Vcc | Vcc |
| "10" | Vcc | GND | 2Vcc/3 |
| "01" | GND | Vcc | Vcc/3 |
| "00" | GND | GND | GND |

Another arrangement is disclosed in the Japanese Patent Application. FIG. 4 illustrates the arrangement of the semiconductor dynamic random access memory device. The semiconductor dynamic random access memory device shown in FIG. 4 is similar to the semiconductor dynamic random access memory device shown in FIG. 1 except for the number of word lines WLUn+1–WLU3n connected to the memory cell array 1e. The word lines WLUn+1–WLU3n are twice as many as the word lines WLUn+1–WLU2n, and, accordingly, the parasitic capacitance 2 Cb coupled to the sub-bit line portions BLU21/CBLU21 is twice as much as the parasitic capacitance Cb coupled to the sub-bit line portions BLU2/CBLU2. The other circuit components are labeled with the same references designating corresponding circuit components of the semiconductor dynamic random access memory device shown in FIG. 1 without detailed description.

When the memory cell MC1d is accessed, the potential levels on the transfer gate control line CTGU shown in FIG. 4 is changed differently from the transfer gate control line CTGU shown in FIG. 1. The memory cell MC1d is assumed to store a quaternary value expressed by "2 Vcc/3".

While the high order bit of the binary value is writing into the sub-bit line pair BLU/CBLU, the transfer gate control line CTGU is in the active high level, and the high order bit reaches the sub-bit line portions BLU21/CBLU21 (see time t5 in FIG. 6). The transfer gate control line CTGU is changed to the inactive low level before the write-in of the low order bit, i.e., at time t6 (see FIG. 5), and the high order bit is stored in the sub-bit line portions BLU21/CBLU21. The low order bit is written into the sub-bit line portions BLU1/CBLU1 (see time t9 in FIG. 6), and does not affect the potential levels on the sub-bit line portions BLU21/CBLU21. The transfer gate control line CTGU is changed to the active high level at time t10 (see FIG. 5), and the potential level Vcp1 at the storage node electrode of the memory cell MC1d is given by equation 2. The transfer gate control line TGU is maintained at the inactive low level at time t10, and the parasitic capacitance Ca does not appear in equation 2.

$$Vcp1 = \{(2Cb+Cs) \cdot Vcc + Cb \cdot 0[V]\} / (3Cb+Cs) \quad \text{equation 2}$$
$$= (2Cb+Cs)Vcc / (3Cb+Cs)$$

The capacitance Cs of the storage capacitor CP1 is ignoreable, and the potential level Vcp1 is approximately equal to 2 Vcc/3.

If a memory cell of the array 1c such as MC3c is accessed, the semiconductor dynamic random access memory device behaves as similar to those shown in FIGS. 5 and 6. When the memory cell MC3c stores the quaternary value "2 Vcc/3", the potential level at the storage node electrode is given by equation 3.

$$Vcp1 = \{2Cb \cdot Vcc + (Cb+Cs) \cdot 0[V]\} / (3Cb+Cs) \quad \text{equation 3}$$
$$= 2Cb \cdot Vcc / (3Cb+Cs)$$

The capacitance Cs is ignoreable, and the restore level Vcp1 is approximately equal to 2 Vcc/3.

Thus, the semiconductor dynamic random access memory device stores a piece of data representative of a quaternary value in each memory cell.

The semiconductor dynamic random access memory device disclosed in Japanese Patent Application No. 8-352635 is based on the fact that the storage capacitance Cs is much smaller than the parasitic capacitance Cb. If the storage capacitance Cs is too large, the storage capacitance Cs is influential on the restore level Vcp1, and the margin between two quaternary values becomes small. This means that the memory cell is liable to unintentionally change the piece of stored data to another quaternary value, and the large storage capacitance results in unreliable stored data. Thus, it is desirable to decrease the storage capacitance in view of the read-out margin.

On the other hand, if the storage capacitance Cs is too small, the potential difference on the associated sub-bit line pair is also small, and the semiconductor dynamic random access memory device is liable to misinterpret the quaternary value of the stored data. The small storage capacitance Cs results in a small operation margin. Thus, there is a trade-off between the reliable data and the stable operation, and this is the problem inherent in the semiconductor dynamic random access memory device disclosed in the Japanese Patent Application.

SUMMARY OF THE INVENTION

It is therefore an important object of the present invention to provide a semiconductor memory device, which reliably stores pieces of multiple-valued data in the memory cells without reduction of the operation margin.

To accomplish the object, the present invention proposes to appropriate weight storage capacitance between sub-bit lines assigned to a high order bit and a sub-bit line assigned to a low order bit by two.

In accordance with one aspect of the present invention, there is provided a semiconductor memory device for storing pieces of multiple-valued data equivalent to more than one bit binary data comprising a plurality of memory cells each storing a piece of the multiple-valued data in a storage capacitor having a storage capacitance, a plurality of sub-bit line pairs selectively connected to the plurality of memory cells, at least one main bit line pair associated with the plurality of sub-bit line pairs, an addressing system rendering the plurality of memory cells selectively accessible and causing a selected one of the plurality of memory cells to produce a first potential difference on one of the plurality of sub-bit line pairs connected to the selected one of the plurality of memory cells, a plurality of transfer gate circuits inserted between the plurality of sub-bit line pairs and selectively connecting the plurality of sub-bit line pairs to one another so as to define a plurality of charge accumulators having respective capacitances weighted by two in the plurality of sub-bit line pairs, a first data transfer circuit connected between another of the plurality of sub-bit line pairs and the at least one main bit line pair and responsive to each potential difference between the first potential difference to a second potential difference propagated to the another of the plurality of bit line pairs for producing a third potential difference to a fourth potential difference on the at least one main bit line pair, a main sense amplifier connected to the at least one main bit line pair and increasing a magnitude of the third potential difference to the magnitude of the fourth potential difference so as to produce a first large potential difference representative of the most significant bit of more than one bit binary data equivalent to the piece of multiple-valued data to a second large potential difference representative of the least significant bit of the more than one bit binary data on the at least one main bit line pair, a potential difference generator responsive to each large potential difference between the first large potential difference and the second large potential difference on the at least one main bit line pair so as to produce a fifth potential difference to the second potential difference propagated to the another of the plurality of sub-bit line pairs, a plurality of second data transfer circuits connected between the at least one main bit line pair and the plurality of charge accumulators and producing a third large potential difference to a fourth large potential difference on the plurality of charge accumulators for storing a first electric charge representative of the most significant bit to a second electric charge representative of the least significant bit in the plurality of charge accumulators, respectively, and a plurality of dummy cells selectively connected to the plurality of charge accumulators and having respective storage capacitances so that total storage capacitances respectively coupled to the plurality of charge accumulators are weighted by two.

BRIEF DESCRIPTION OF THE DRAWINGS

The features and advantages of the semiconductor memory device will be more clearly understood from the following description taken in conjunction with the accompanying drawings in which:

FIG. 14 is a timing chart showing the potential waveforms on the main/sub bit lines incorporated in the semiconductor dynamic random access memory device.

DESCRIPTION OF THE PREFERRED EMBODIMENTS

First Embodiment

Figure 7:
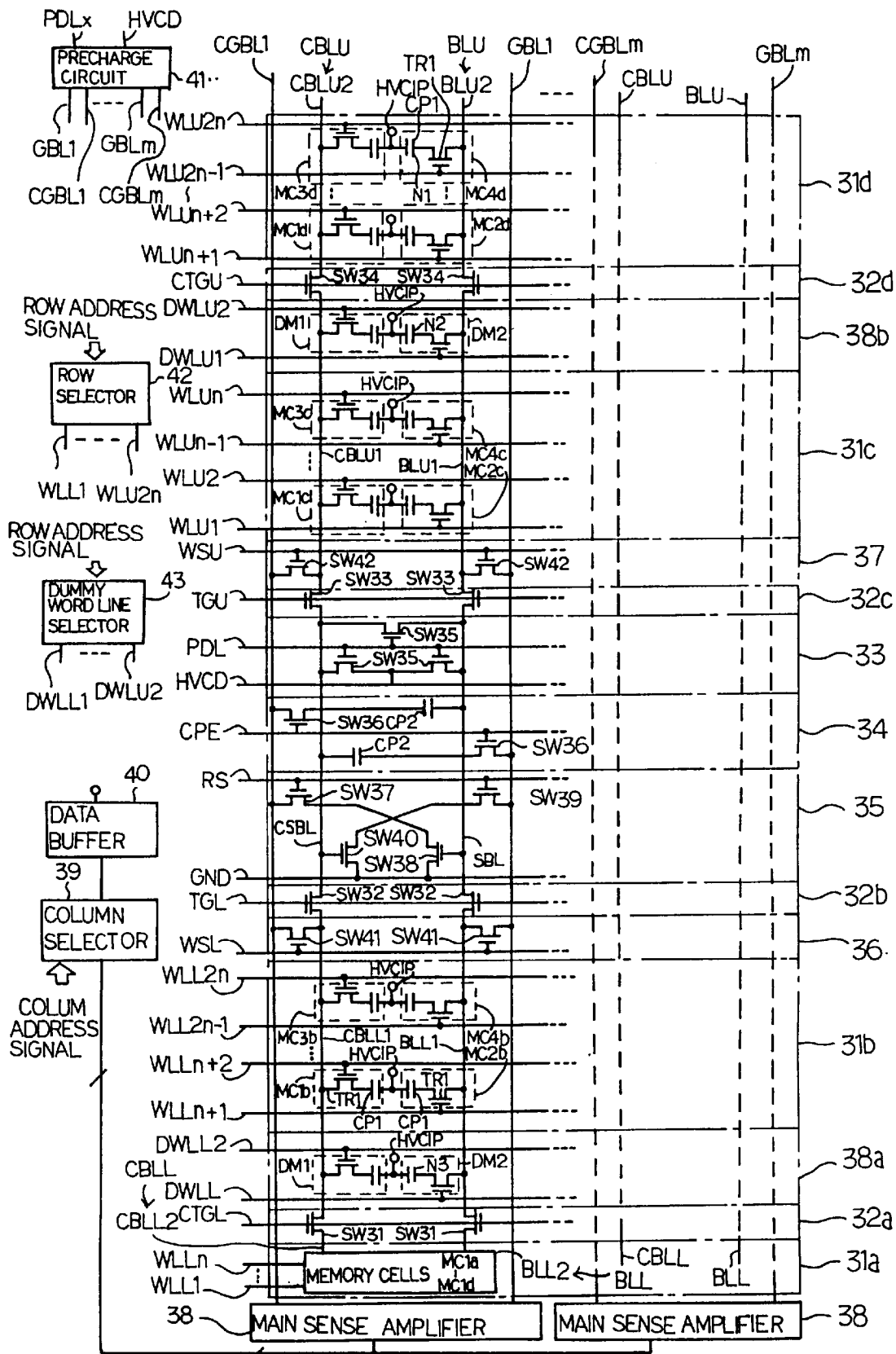
FIG. 7 is a circuit diagram showing the arrangement of a semiconductor dynamic random access memory device according to the present invention.

Referring to FIG. 7 of the drawings, a semiconductor dynamic random access memory device comprises four memory cell arrays 31a/31b/31c/31d. The four memory cell arrays 31a–31d are associated with plural main bit line pairs GBL1/CGBL1 to GBLm/CGBLm, and each of the main bit line pairs GBL1/CGBL1–GBLm/CGBLm is associated with sub-bit line pairs BLL/CBLL, SBL/CSBL and BLU/CBLU. A circuit arrangement associated with the main bit line pair GBL1/CGBL1 is repeated for the other main bit line pairs, and description is only made on the circuit arrangement associated with the main bit line pair GBL1/CGBL1 for the sake of simplicity. For this reason, even though the memory cell arrays 31a to 31d are referred to in the following description, the terms are applied to memory cells of the memory cell arrays 31a to 31d connected to the sub-bit line pairs BLL/CBLL, SBL/CSBL and BLU/CBLU associated with the main bit line pair GBL1/CGBL1.

The memory cell arrays 31a/31b and the memory cell arrays 31c/31d are respectively connected to the sub-bit line BLL/CBLL and the sub-bit line BLU/CBLU, and the sub-bit line pair SBL/CSBL is shared between the memory cell arrays 31a/31b and the memory cell arrays 31c/31d. The memory cell arrays 1a/1b/1c/1d are further associated with a main bit line pair GBL/CGBL.

Figure 1:
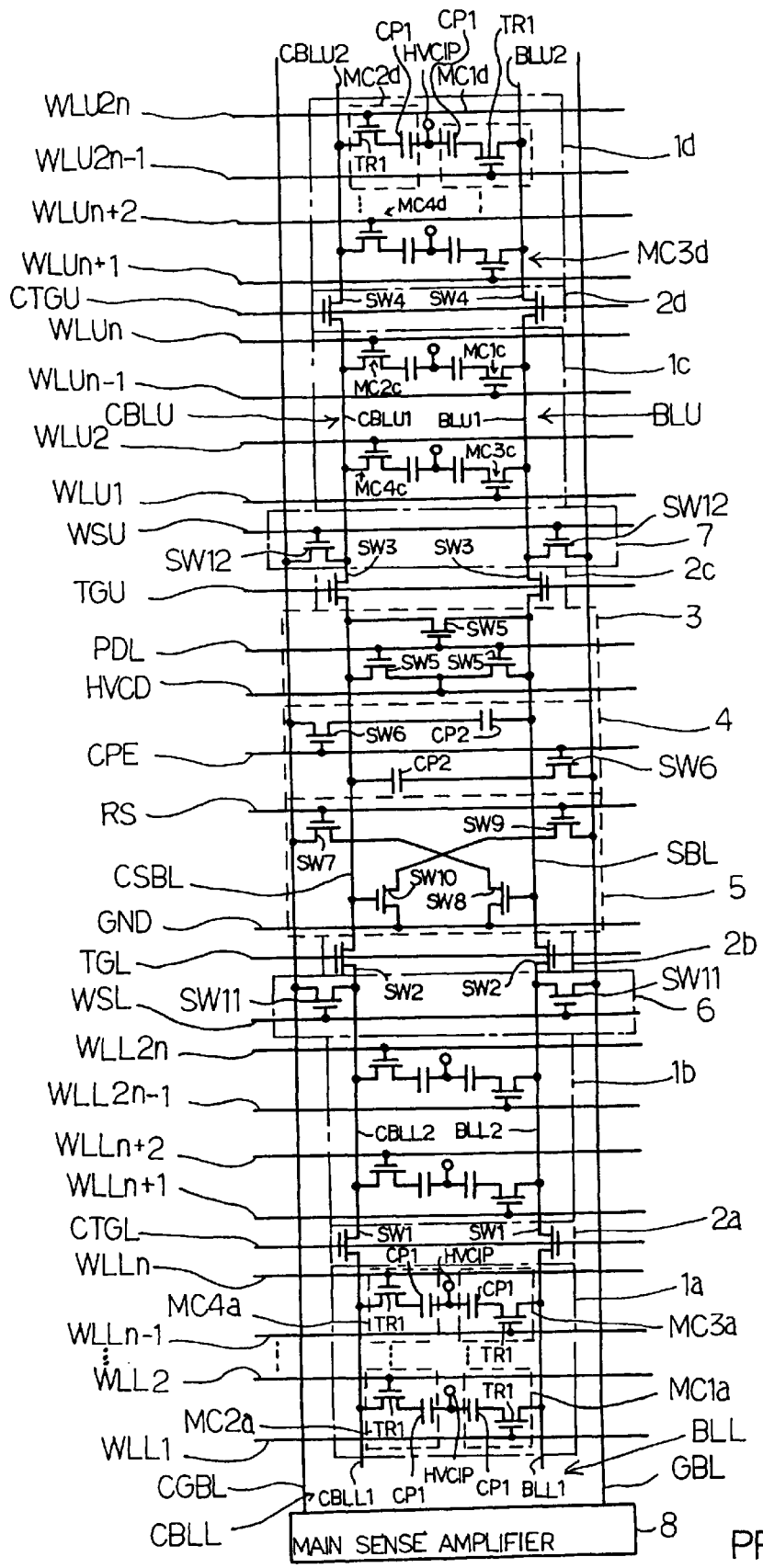
FIG. 1 is a circuit diagram showing the arrangement of the semiconductor dynamic random access memory device disclosed in Japanese Patent Application No. 8-352635.
Figure 2:
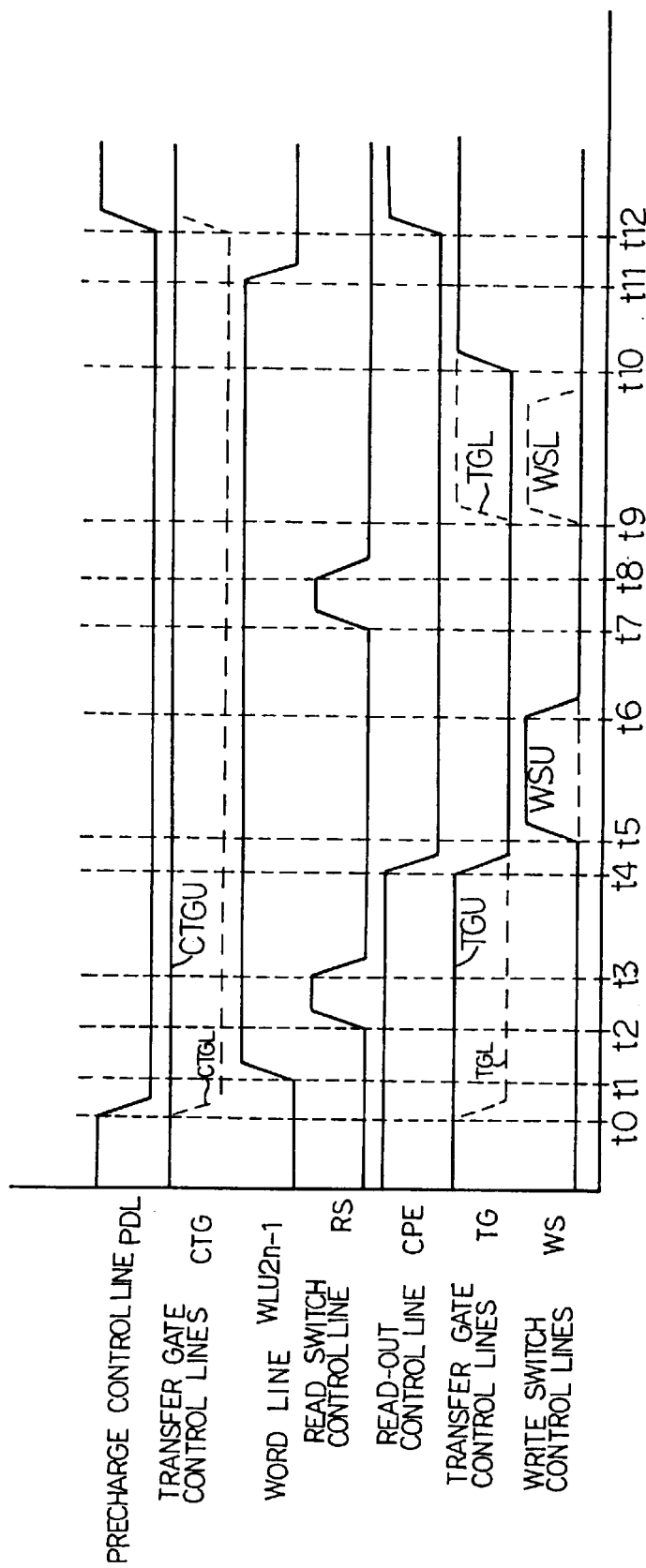
FIG. 2 is a timing chart showing the potential waveforms on the control lines incorporated in the semiconductor dynamic random access memory device.
Figure 3:
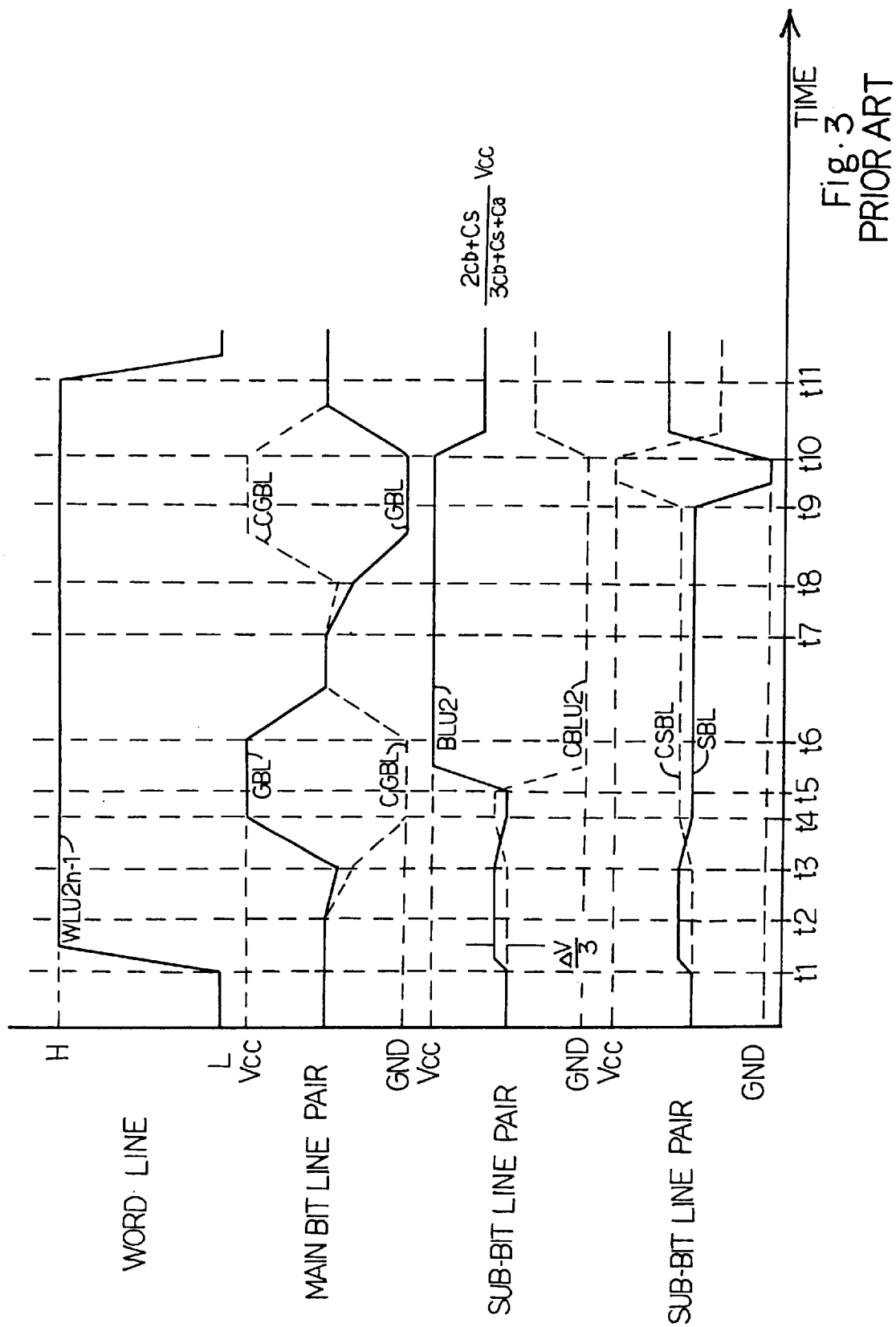
FIG. 3 is a timing chart showing the potential waveforms on the main/sub bit lines incorporated in the semiconductor dynamic random access memory device.

Plural memory cells MC1b–MC4b are incorporated in the memory cell array 31b, and each of the memory cells MC1b–MC4b is implemented by a series combination of an n-channel enhancement type access transistor TR1 and a storage capacitor CP1 as similar to the memory cells shown in FIG. 1. The storage capacitor CP1 is designed to have capacitance Cs. The series combination is connected between one BLL of the bit lines BLL/CBLL and a cell plate line HVCIP, and another series combination is connected between the other bit line CBLL and the cell plate line HVCIP. The cell plate line HVCIP is fixed to a half Vcc/2 of the positive power voltage level Vcc. The memory cell array 31b is further associated with plural word lines WLLn+1, WLLn+2 . . . WLL2n−1 and WLL2n, and the word lines WLL1;1–WLL2n are connected to the gate electrodes of the n-channel enhancement type access transistors TR1 of the rows of memory cells MC1b/MC2b . . . and MC3b/MC4b, respectively. Each of the memory cells MC1b–MC4b stores a piece of multiple-valued data having a quaternary value. Vcc and GND are representative of the positive power voltage and a ground level, respectively. The potential level at the storage node electrode of the capacitor CP1 has a potential level Vcc, 2 Vcc/3, Vcc/3 or GND, and the four potential level Vcc, 2 Vcc/3, Vcc/3 and GND are corresponding to a binary value "11", "10", "01" and "00", respectively.

The other memory cells of the arrays 31a/31c/31d are labeled with MC1a/MC2a/MC3a/MC4a, MC1c/MC2c/

MC3c/MC4c and MC1d/MC2d/MC3d/MC4d, respectively, and the word lines associated with the memory cell arrays 31a/31c/31d are labeled with WLL1 . . . WLLn, WLU1/ WLU2/ . . . WLUn−1/WLUn and WLUn+1/WLUn+2 . . . /WLU2n−1/WLU2n. The other memory cell arrays 31a/31c/ 31d and the associated word lines WLLn–WLLn/ WLU2–WLUn/WLUn+1–WLU2n are arranged as similar to the memory cell array 31b and the associated word lines WLLn+1–WLL2n, and, for this reason, detailed description is omitted hereinbelow.

The semiconductor dynamic random access memory device further comprises transfer gate arrays 32a/32b/32c/ 32d. The transfer gate array 32a is inserted into the sub-bit line pair BLL/CBLL, and splits the sub-bit line pair BLL/ CBLL into sub-bit line portions BLL1/CBLL1 and BLL2/ CBLL2. The transfer gate array 32a is implemented by n-channel enhancement type switching transistors SW31, and the n-channel enhancement type switching transistors SW31 are gated by a transfer gate control line CTGL. The transfer gate array 32a electrically connects the sub-bit line portions BLL1/CBLL1 to and isolates them from the sub-bit line portions BLL2/CBLL2. The transfer gate array 32b is inserted between the sub-bit line portions BLL1/CBLL1 and the sub-bit line pair SBL/CSBL, and is implemented by n-channel enhancement type switching transistors SW32. A transfer gate control line TGL is connected to the gate electrodes of the n-channel enhancement type switching transistors SW32, and the sub-bit line pair SBL/CSBL is electrically connected to and isolated from the sub-bit line portions BLL1/CBLL1.

The transfer gate array 32c is inserted between the sub-bit line pair BLU/CBLU and the sub-bit line pair SBL/CSBL, and is implemented by n-channel enhancement type switching transistors SW33. A transfer gate control line TGU is connected to the gate electrodes of the n-channel enhancement type switching transistors SW33, and the sub-bit line pair SBL/CSBL is electrically connected to and isolated from the sub-bit line pair BLU/CBLU.

The transfer gate array 32d is inserted into the sub-bit line pair BLU/CBLU, and splits the sub-bit line pair BLU/CBLU into sub-bit line portions BLU1/CBLU1 and BLU2/CBLU2. The transfer gate array 32d is implemented by n-channel enhancement type switching transistors SW34, and the n-channel enhancement type switching transistors SW34 are gated by a transfer gate control line CTGU. The transfer gate array 32d electrically connects the sub-bit line portions BLU1/CBLU1 to and isolates them from the sub-bit line portions BLU2/CBLU2. In this instance, each sub-bit line portions BLL1/CBLL1, BLL2/CBLL2, BLU1/CBLU1 or BLU2/CBLU2 are associated with n word lines, and parasitic capacitance Cb is coupled to each sub-bit line portions BLL1/CBLL1, BLL2/CBLL2, BLU1/CBLU1 or BLU2/ CBLU2. On the other hand, parasitic capacitance Ca is coupled to the sub-bit line pair SBL/CSBL.

The semiconductor dynamic random access memory device further comprises a precharging circuit 33, a read-out circuit 34 and a sub-sense amplifier 35. The precharging circuit 33 charges and equalizes the sub-bit line pairs BLL/ CBLL, SBL/CSBL and BLU/CBLU, and is implemented by n-channel enhancement type switching transistors SW35. Two of the n-channel enhancement type switching transistors SW35 are connected between a potential line HVCD and the sub-bit lines SBL/CSBL, and the third n-channel enhancement type field effect transistor SW35 is connected between the sub-bit lines SBL and CSBL. The potential line HVCD supplies a precharge level Vcc/2 through the n-channel enhancement type switching transistors SW35 to the sub-bit lines SBL/CSBL. The n-channel enhancement type switching transistors SW35 are concurrently gated by a precharge control line PDL, and the third n-channel enhancement type switching transistor SW35 strictly balances the sub-bit lines SBL/CSBL at the precharge level Vcc/2.

The read-out circuit 34 includes a series combination of an n-channel enhancement type switching transistor SW36 and a capacitor CP2 connected between the sub-bit line SBL and the main bit line CGBL1 and another series combination of an n-channel enhancement type switching transistor SW36 and a capacitor CP2 connected between the sub-bit line CSBL and the main bit line GBL1, and the n-channel enhancement type switching transistors SW36 are gated by a read-out control line CPE. The read-out circuit 34 converts a piece of multiple valued data read out from a memory cell between a potential difference on the sub-bit line pair SBL/CSBL and another potential difference on the main bit line pair GBL1/CGBL1.

The sub-sense amplifier 35 includes a series combination of n-channel enhancement type field effect transistors SW37/SW38 connected between the main bit line CGBL1 and a ground line GND and another series combination of n-channel enhancement type field effect transistors SW39/ SW40 connected between the main bit line GBL1 and the ground line GND. The n-channel enhancement type field effect transistors SW37/SW39 are gated by a read switch control line RS, and the other n-channel enhancement type field effect transistors SW38/SW40 are respectively gated by the sub-bit lines SBL/CSBL. The sub-sense amplifier 35 is activated by the read switch control line RS, and is responsive to the potential difference on the sub-bit line pair SBL/CSBL for increasing the magnitude of the potential difference on the main bit line GBL1/CGBL1.

The semiconductor dynamic random access memory device further comprises write-in circuits 36/37. The write-in circuit 36 is implemented by n-channel enhancement type switching transistors SW41, and the n-channel enhancement type switching transistors SW41 are connected between the sub-bit line portions BLL1/CBLL1 and the main bit line pair GBL1/CGBL1. The n-channel enhancement type switching transistors SW41 are gated by a write switch control line WSL, and the potential difference on the main bit line pair GBL1/CGBL1 is transferred to the sub-bit line portions BLL1/CBLL1. The other write-in circuit 37 is also implemented by n-channel enhancement type switching transistors SW42, and the n-channel enhancement type switching transistors SW42 are connected between the sub-bit line portions BLU1/CBLU1 and the main bit line pair GBL1/ CGBL1. The n-channel enhancement type switching transistors SW42 are gated by a write switch control line WSU, and the potential difference on the main bit line pair GBL1/ CGBL1 is transferred to the sub-bit line portions BLU1/ CBLU1.

The semiconductor dynamic random access memory device further comprises a main sense amplifier 38 also connected to the main bit line pair GBL1/CGBL1, a column selector 39, a data buffer 40, a precharging circuit 41 connected to the main bit line pair GBL1/CGBL1 and a row selector 42 for selectively changing the word lines WLL1 to WLU2n to an active high level. The precharging circuit 41 charges the main bit line pair GBL1/CGBL1 to the precharge level Vcc/2, and balances the main bit lines GBL1/ CGBL1 with each other. The main sense amplifier 38 increases the magnitude of potential difference on the main bit lines GBL1/CGBL1. The main sense amplifier 38 is connected to the column selector 39, and the column selector 39 selects one of the main sense amplifiers 39 so as to connected it to the data buffer 40.

The semiconductor dynamic random access memory device further comprises dummy memory cell arrays 38a/38b and a dummy word line selector 43. The dummy memory cell arrays 38a/38b are newly added to the semiconductor dynamic random access memory device, and make the semiconductor dynamic random access memory device according to the present invention discriminative from the semiconductor dynamic random access memory device shown in FIGS. 1 and 4.

Each of the dummy memory cell arrays 38a/38b is implemented by dummy memory cells DM1/DM2 connected between the cell plate line HVCIP and the associated sub-bit line portions BLL1/CBLL1 or BLU1/CBLU1, and the series combination of the n-channel enhancement type access transistor TR1 and the storage capacitor CP1 serves as each dummy memory cell DM1/DM2. Dummy word lines DWLL1/DWLL2 or DWLU1/DWLU2 are connected to the n-channel enhancement type access transistors of the dummy memory cell array 38a/38b, respectively, and the dummy word line selector 43 selectively changes the dummy word lines DWLL1 to DWLU2 to the active high level. The dummy memory cells DM1/DM2 are fabricated through a process for fabricating the memory cells MC1a to MC4d, and have dimensions same as those of the memory cells MC1a to MC4d. For this reason, each dummy cell has storage capacitance equal to that of the memory cell MC1a–MC4d.

Figure 8:
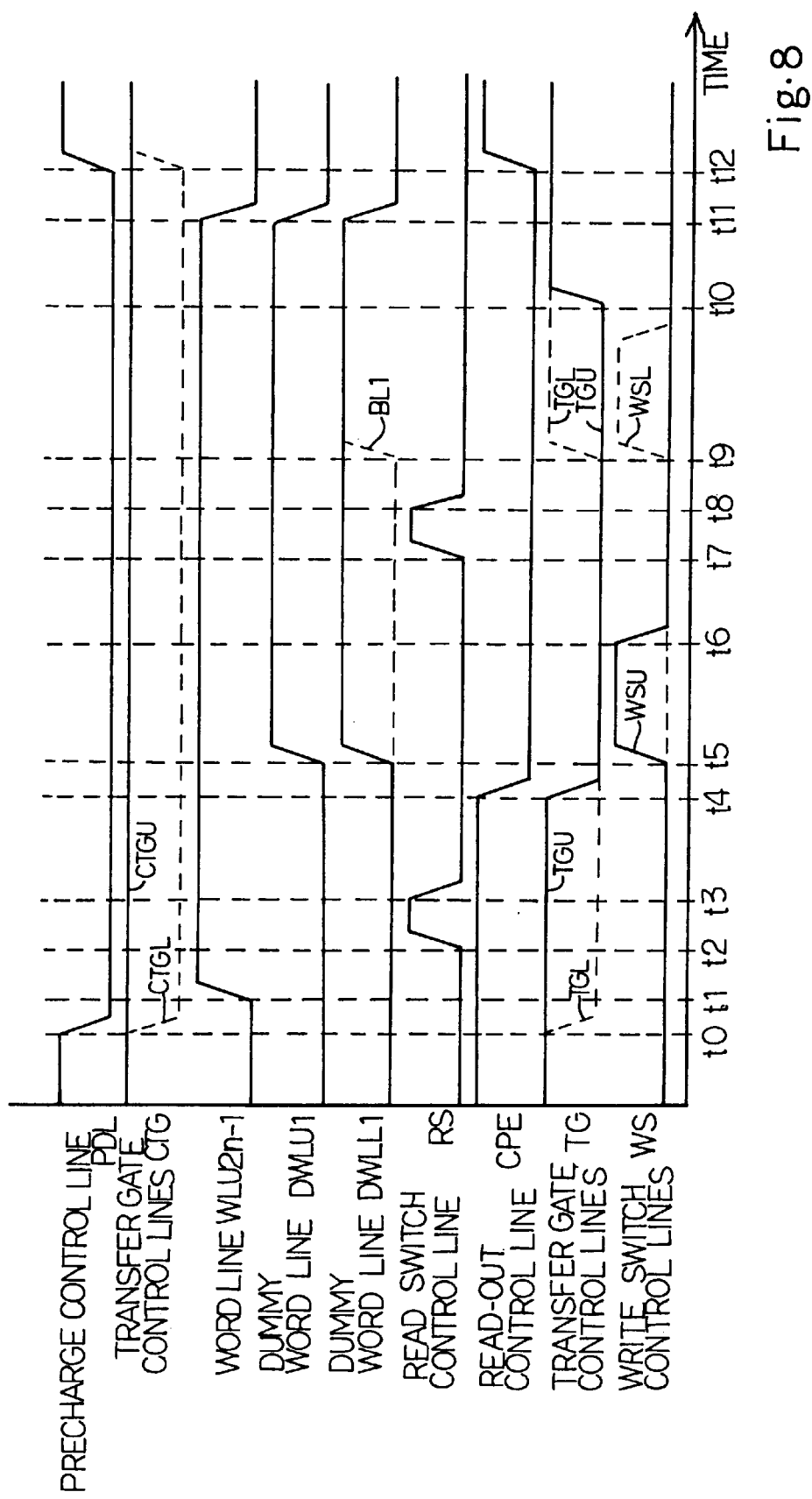
FIG. 8 is a timing chart showing the potential waveforms on control lines incorporated in the semiconductor dynamic random access memory device.
Figure 9:
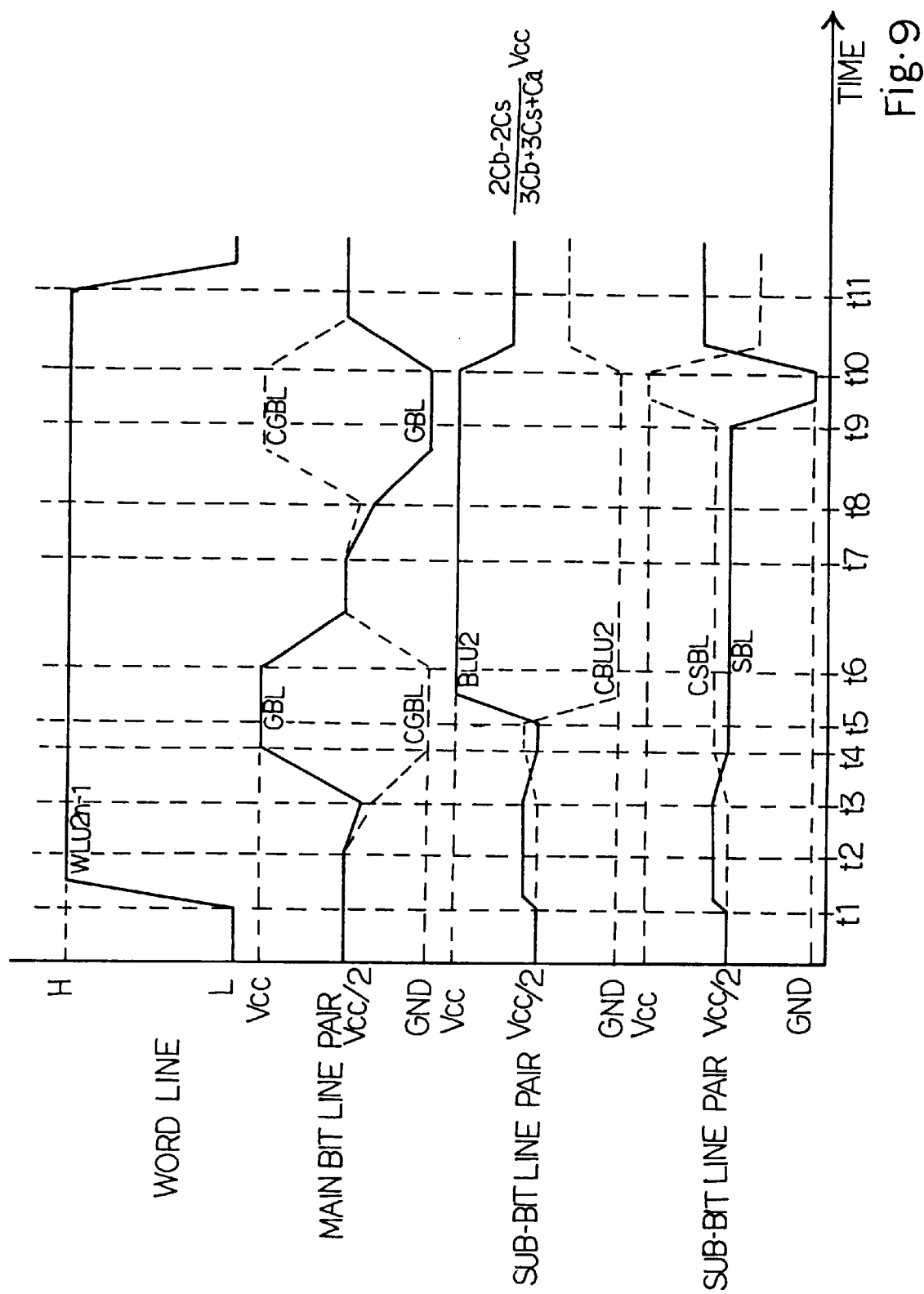
FIG. 9 is a timing chart showing the potential waveforms on main/sub bit lines incorporated in the semiconductor dynamic random access memory device.

Assuming now that the memory cell MC4d stores a piece of multiple valued data representative of a quaternary value of "2 Vcc/3". When an external device accesses the piece of multiple-valued data stored in the memory cell MC4d, the semiconductor dynamic random access memory device shown in FIG. 7 behaves as shown in FIGS. 8 and 9.

The precharging circuit 33 has already balanced the sub-bit lines BLL/CBLL, SBL/CSBL and BLU/CBLU at the precharging level Vcc/2 before time t0. The main bit line pair GBL1/CGBL1 has been also balanced at the precharge level Vcc/2 before time t0.

The precharge control line PDL and the transfer gate control lines CTGL/TGL are changed to inactive low level at time t0. The inactive low level on the precharge control line PDL causes the n-channel enhancement type switching transistors SW35 to turn off, and the sub-bit line pair SBL/CSBL is electrically isolated from the potential line HVCD. The inactive low level on the transfer gate control lines CTGL/TGL cause the n-channel enhancement type switching transistors SW3 1 and SW32 to turn off, and the sub-bit line portions BLL1/CBLL1 are electrically isolated from the sub-bit line portions BLL2/CBLL2 and the sub-bit line pair SBL/CSBL.

The word line WLU2n–1 is changed to the active high level at time t1, and the n-channel enhancement type access transistor TR1 of the memory cell MC4d turns on so as to electrically connect the storage node electrode N1 of the capacitor CP1 to the associated sub-bit line portion BLU2. Since the transfer gate control lines CTGU/TGU are in the active high level, the sub-bit line portions BLU2/CBLU2 are electrically connected to the sub-bit line portions BLU1/CBLU1 and the sub-bit line pair SBL/CSBL, and small potential difference is produced on the sub-bit line portions BLU2/CBLU2, BLU1/CBLU1 (see FIG. 9) and the sub-bit line pair SBL/CSBL. The electric charge stored in the capacitor CP1 slightly lifts the potential level on the sub-bit line portions BLU2/BLU1 and the sub-bit line SBL. When the storage node electrode N1 is in the potential level Vcc, the small potential difference is ΔV. The storage node electrode N1 at 2 Vcc/3 causes the small potential difference to be equal to ΔV/3.

The read switch control line RS is changed to the active high level at time t2 (see FIG. 8), and the n-channel enhancement type switching transistors SW37/SW39 turn on so as to activate the sub-sense amplifier 35. The n-channel enhancement type field effect transistor SW38 has channel conductance larger than that of the other n-channel enhancement type field effect transistor SW40, and the potential difference is transferred from the sub-bit line pair SBL/CSBL to the main bit line pair GBL1/CGBL1 (see FIG. 9).

The read switch control line RS is changed to the inactive low level at time t3, and the sub-sense amplifier 35 is deactivated. Thereafter, the main sense amplifier 38 is activated, and the main sense amplifier 8 increases the potential difference on the main bit line pair GBL1/CGBL1. The main bit lines GBL1 and CGBL1 reach the positive power voltage level Vcc and the ground level GND. The large potential difference is representative of the high order bit of the binary value "10", and is propagated through the column selector 39 to the data buffer 40.

The read-out control line CPE is in the active high level, and the n-channel enhancement type switching transistors SW36 are turned. For this reason, while the main sense amplifier 38 is increasing the potential difference on the main bit line pair GBL1/CGBL1, the capacitor CP2 decreases the potential level on the sub-bit lines SBL/BLU by ΔV/3, and the other capacitor CP2 increases the potential level on the sub-bit lines CSBL/CBLU by ΔV/3. Thus, the capacitors CP2 invert the potential levels on the sub-bit line pair SBL/CSBL and the sub-bit line portions BLU1/CBLU1 and BLU2/CBLU2 between time t3 and time t4. If the piece of multiple-valued data is equivalent to the binary value "11" or "00", the potential inversion does not take place.

The read-out control line CPE and the transfer gate control line TGU are changed to the inactive low level at time t4. The inactive low level on the read-out control line CPE causes the n-channel enhancement type switching transistors SW36 to turn off, and the sub-bit line pair SBL/CSBL is electrically isolated from the main bit line pair GBL1/CGBL1. Thus, the sub-bit line pair SBL/CSBL is released from the electrical influence of the main bit line pair GBL1/CGBL1. The inactive low level on the transfer gate control line TGU causes the n-channel enhancement type switching transistors SW33 to turn off, and the sub-bit line pair SBL/CSBL is electrically isolated from the sub-bit line portions BLU1/CBLU1 and BLU2/CBLU2.

The write switch control line WSU and the dummy ward lines DWLU1/DWLL1 are changed to the active high level at time t5 (see FIG. 8). The active high level on the dummy word line DWLU1 causes the n-channel enhancement type field effect transistor of the dummy cell DM2 to turn on, and the storage node electrode N2 is electrically connected to the sub-bit line portion BLU1. The active high level on the write switch control line WSU causes the n-channel enhancement type switching transistors SW42 turn on, and the large potential difference is transferred from the main bit line pair GBL1/CGBL1 to the sub-bit line portions BLU1/CBLU1 and BLU2/CBLU2 (see FIG. 9). Thus, the high order bit of the binary value "10" is stored on the sub-bit line portions BLU1/CBLU1 and BLU2/CBLU2 and the storage node electrodes N1/N2.

The write switch control line WSU is changed to the inactive low level at time t6 (see FIG. 8), and the n-channel enhancement type switching transistors SW42 turn off.

Then, the sub-bit line pair BLU/CBLU is electrically isolated from the main bit line pair GBL1/CGBL1. The main bit line pair GBL1/CGBL1 is changed and balanced at the precharge level Vcc/2.

The read switch control line RS is changed to the active high level at time t7 (see FIG. 8), and the sub-sense amplifier 35 is activated again. The sub-bit line pair SBL/CSBL keeps the inverted potential difference, and the sub-sense amplifier 35 transfers the inverted potential difference from the sub-bit line pair SBL/CSBL to the main bit line pair GBL1/CGBL1 (see FIG. 9).

The read switch control line RS is changed to the inactive low level at time t8 (see FIG. 8), and the main sense amplifier 38 is activated again. The inactive low level on the read switch control line RS causes the sub-sense amplifier 35 to stop the differential amplification. Then, the main sense amplifier 38 increases the magnitude of the inverted potential difference on the main bit line pair GBL1/CGBL1, and the main bit lines CGBL1 and GBL1 reach the positive power voltage level Vcc and the ground level GND, respectively. The large potential difference is representative of the low order bit of the binary value "10", and is transferred through the column selector 39 to the data buffer 40.

The transfer gate control line TGL and the write switch control line WSL are changed to the active high level at time t9 (see FIG. 8). The active level on the transfer gate control line TGL causes the n-channel enhancement type switching transistors SW32 to turn on, and the bit line portions BLL1/CBLL1 are electrically connected to the sub-bit line pair SBL/CSBL. The active high level on the write switch control line WSL causes the n-channel enhancement type switching transistors SW41 to turn on, and the large potential difference is transferred from the main bit line pair GBL1/CGBL1 to the sub-bit line portions BLL1/CBLL1 and the sub-bit line pair SBL/CSBL (see FIG. 9). The dummy word line DWLL1 has been already changed to the active high level, the ground level is transferred from the sub-bit line portion BLL1 to the storage node electrode N3 of the dummy cell DM2. Thus, the low order bit "0" is stored on the storage node N3 and the bit line portion BLL1.

Although the dummy word line DWLL1 is changed to the active high level at time t5, it may be changed to the active high level at time t9 as indicated by broken line BL1.

The write switch control line WSL is changed to the inactive low level between time t9 and time t10, and the sub-bit line portions BLL1/CBLL1 are electrically isolated from the main bit line pair GBL1/CGBL1 (see FIG. 8). Thus, the high order bit "1" is stored on the sub-bit line portions BLU1/BLU2 and the storage node electrodes N1/N2, and the low order bit "0" is stored on the sub-bit line portion BLL1, the storage node electrode N3 and the sub-bit line SBL.

The transfer gate control line TGU is changed to the active high level at time t10 (see FIG. 8), and the sub-bit lines SBL/CSBL are electrically connected to the sub-bit portions BLL1/CBLL1. The active high level on the transfer gate control line CTGU keeps the n-channel enhancement type switching transistors SW34 in on-state, and the sub-bit lines SBL/CSBL are further connected to the sub-bit line portions BLL2/CBLL2. Then, the restore level at the storage node electrode N1 is given by equation 4.

$$Vn1 = \{(2Cb + 2Cs) \cdot Vcc + (Cb + Cs + Ca) \cdot 0[V]\}/(3Cb + 3Cs + Ca)$$ equation 4

-continued
$$= (2Cb + 2Cs) \cdot Vcc / (3Cb + 3Cs + Ca)$$

The parasitic capacitance Ca is much smaller than the parasitic capacitance Cb. For this reason, equation 4 is rewritten as $$Vn1 \approx \{(2Cb+2Cs)/(3Cb+3Cs)\}Vcc=(2/3) Vcc$$ equation 4'

The ratio of storage capacitance Cs between the storage node electrodes N1/N2 and the storage node electrode N3 is equal to the ratio of parasitic capacitance between the sub-bit line portions BLU1/BLU2 and the sub-bit line portion BLL1. For this reason, even though the storage capacitance Cs is increased, the large storage capacitance Cs does not affect the restore level Vn1. In order words, when the operation margin is increased, the read-out margin is never decreased.

Although the read-out operation is described on the assumption that the memory cell MC4d stores the quaternary value corresponding to the binary value "10", the semiconductor dynamic random access memory device exactly adjusts the restore level Vn1 to Vcc/3 for a piece of multiple-valued data equivalent to "01".

When a piece of multiple-valued data is written into a selected memory cell, a high order bit is stored on the storage node electrode of the selected memory cell, the associated bit line portions and the storage node electrode of the dummy cell through the operation between time t5 and t6, the transfer gate disconnects the associated bit line portions from the other bit line portions, and a low order bit is stored on the other bit line portion and the storage node electrode of the dummy cell as similar to the operation between time t9 and time t10. Thereafter, the bit line portions are connected to one another, and the selected memory cell stores the restore level.

In the first embodiment, the bit line portions BLU1/CBLU1, BLU2/CBLU2, BLL1/CBLL1/BLL2/CBLL2 and the sub-bit line pair SBL/CSBL are corresponding to a plurality of bit line pairs. The row selector 42, the word lines WLL1–WLU2n the column selector 39 as a whole constitute an addressing system. The transfer gate arrays 32a to 32d are corresponding to a plurality of transfer gate circuits. The sub-sense amplifier circuit 35 serves as a first data transfer circuit. The read-out circuit 34 serves as a potential difference generator. The write-in circuits 36/37 are corresponding to a plurality of second data transfer circuits. The parasitic capacitances Cb respectively coupled to the sub-bit line portions BLL1/CBLL1, BLL2/CBLL2, BLU1/CBLU1 and BLU2/CBLU2 form a plurality of charge accumulators.

Second Embodiment

Figure 10:
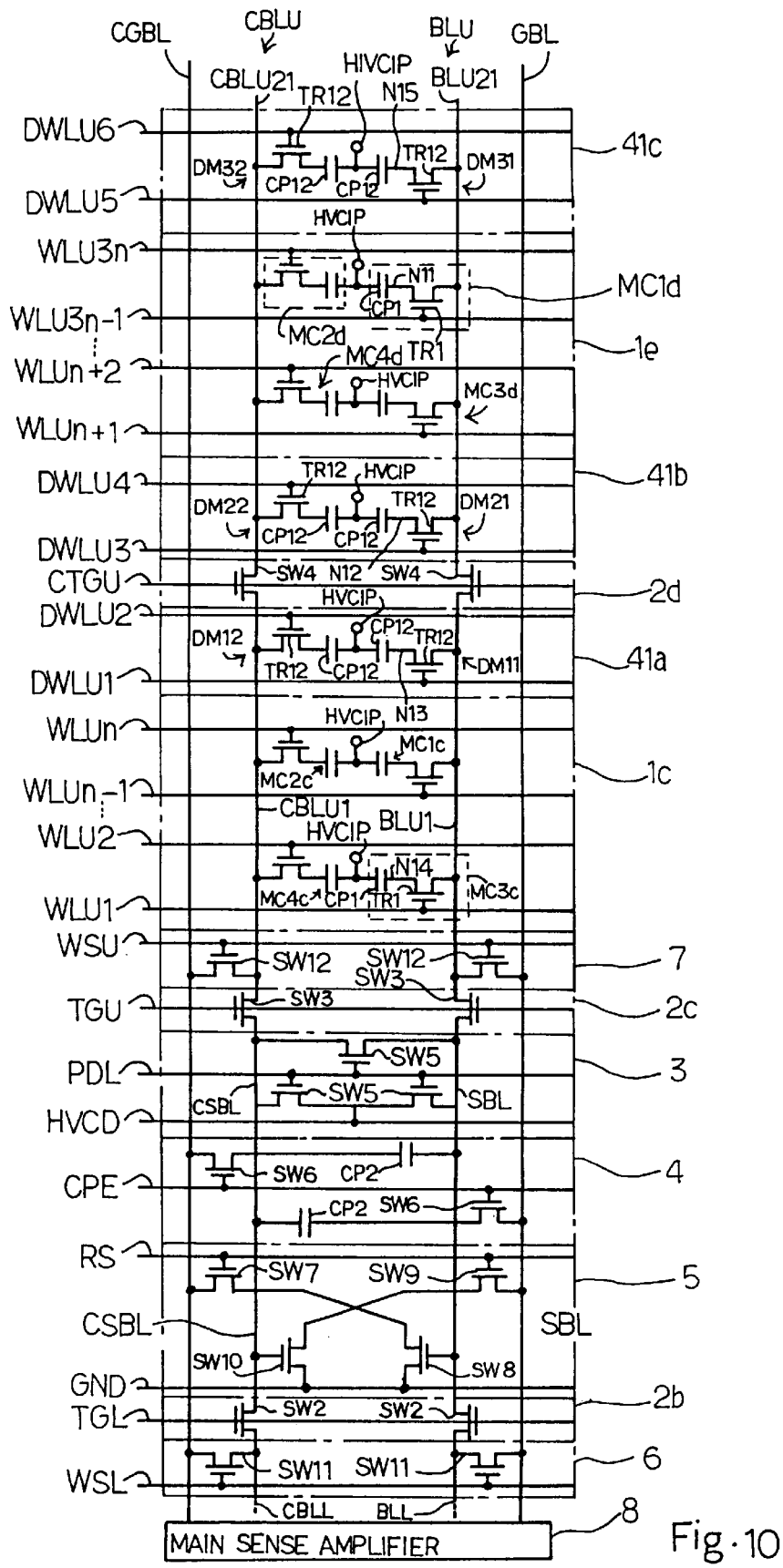
FIG. 10 is a circuit diagram showing the arrangement of another semiconductor dynamic random access memory device according to the present invention.

FIG. 10 illustrates another semiconductor dynamic random access memory device embodying the present invention. The semiconductor dynamic random access memory device implementing the second embodiment is corresponding to the semiconductor dynamic random access memory device shown in FIG. 4. For this reason, circuit components and signal lines of the second embodiment are labeled with the same references designating corresponding circuit components and corresponding signal lines of the semiconductor dynamic random access memory device shown in FIG. 4.

Figure 4:
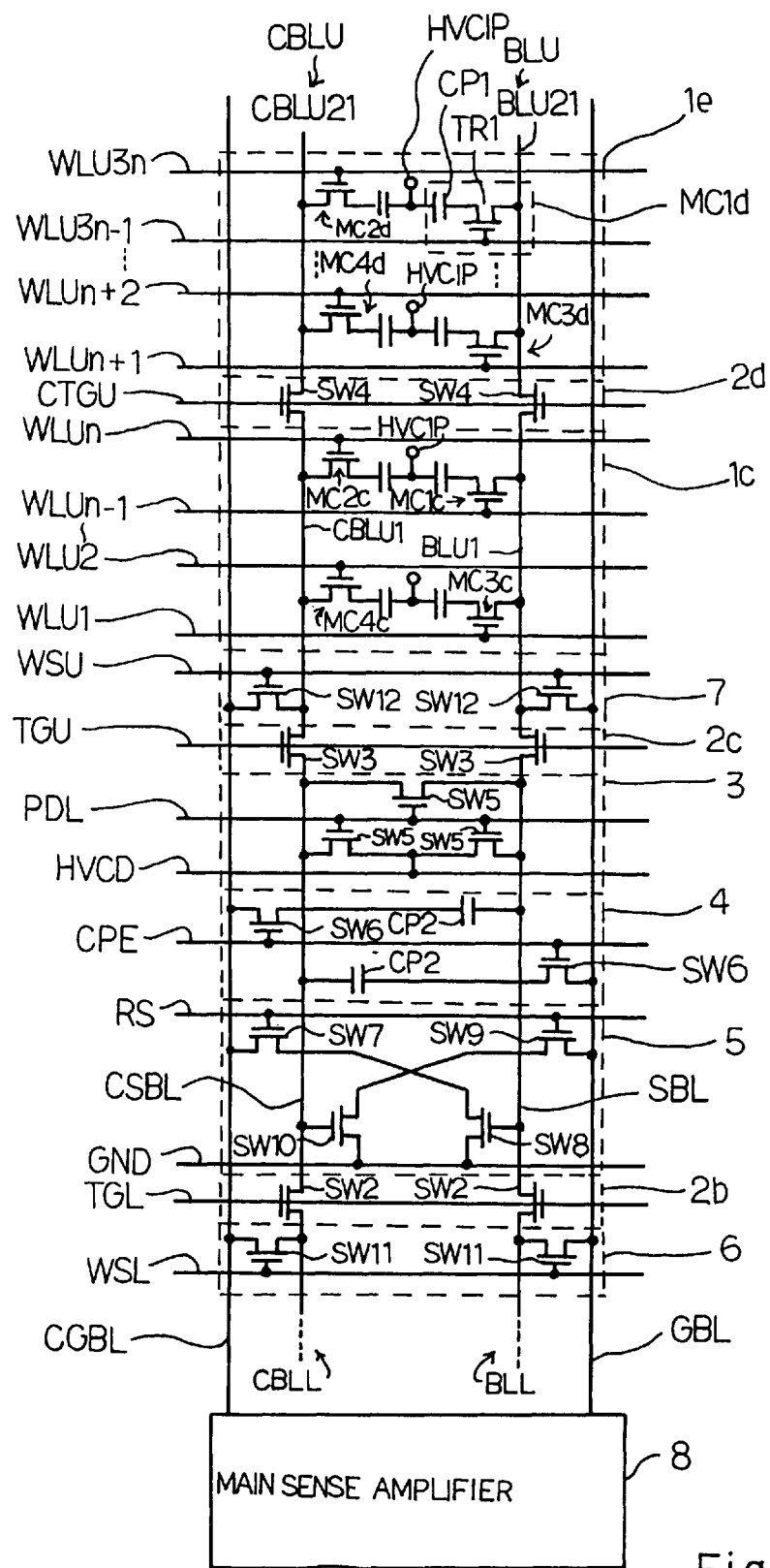
FIG. 4 is a circuit diagram showing another arrangement of the semiconductor dynamic random access memory device disclosed in Japanese Patent Application No. 8-352635.
Figure 5:
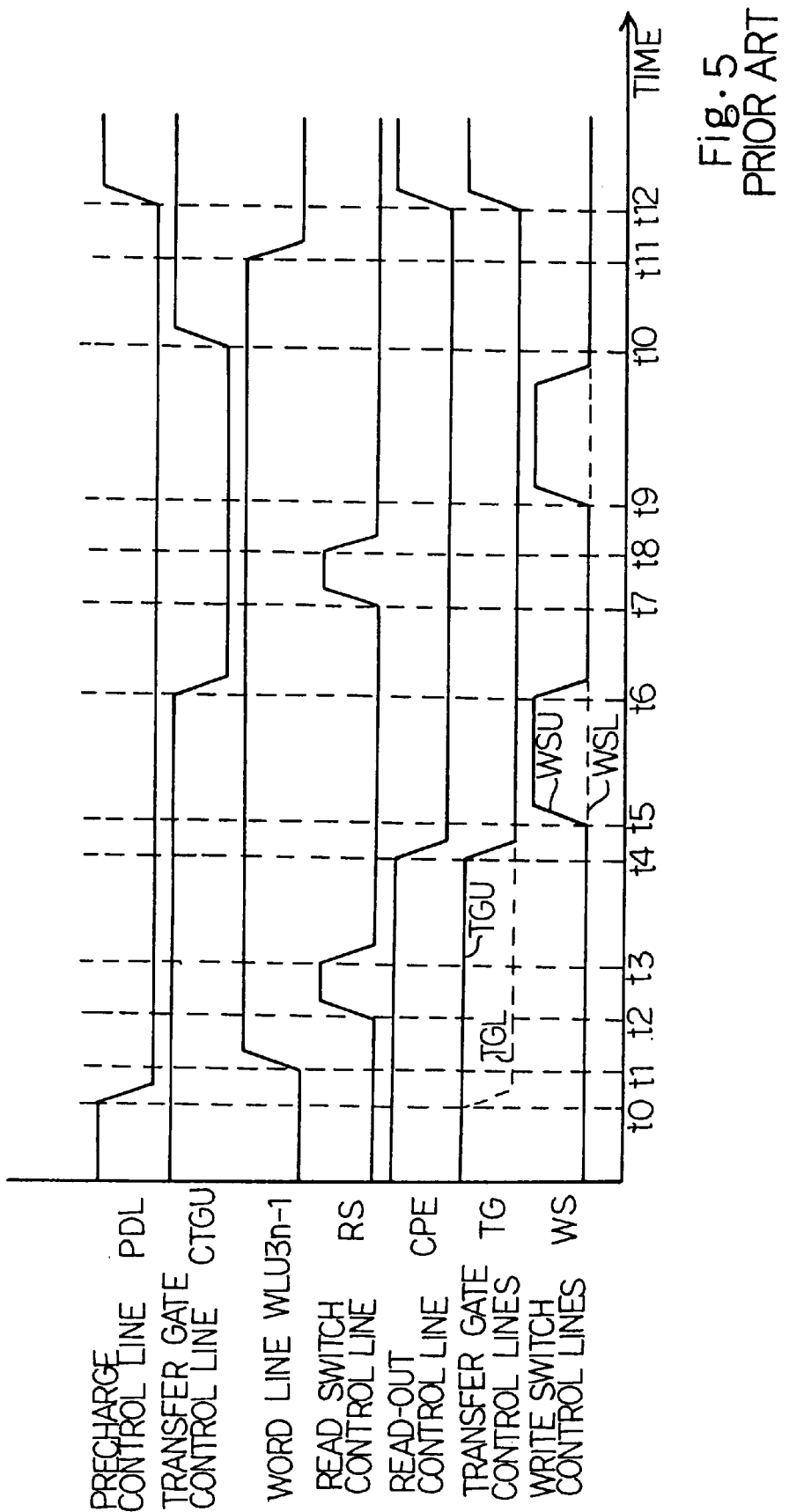
FIG. 5 is a timing chart showing the potential waveforms on the control lines incorporated in the semiconductor dynamic random access memory device.
Figure 6:
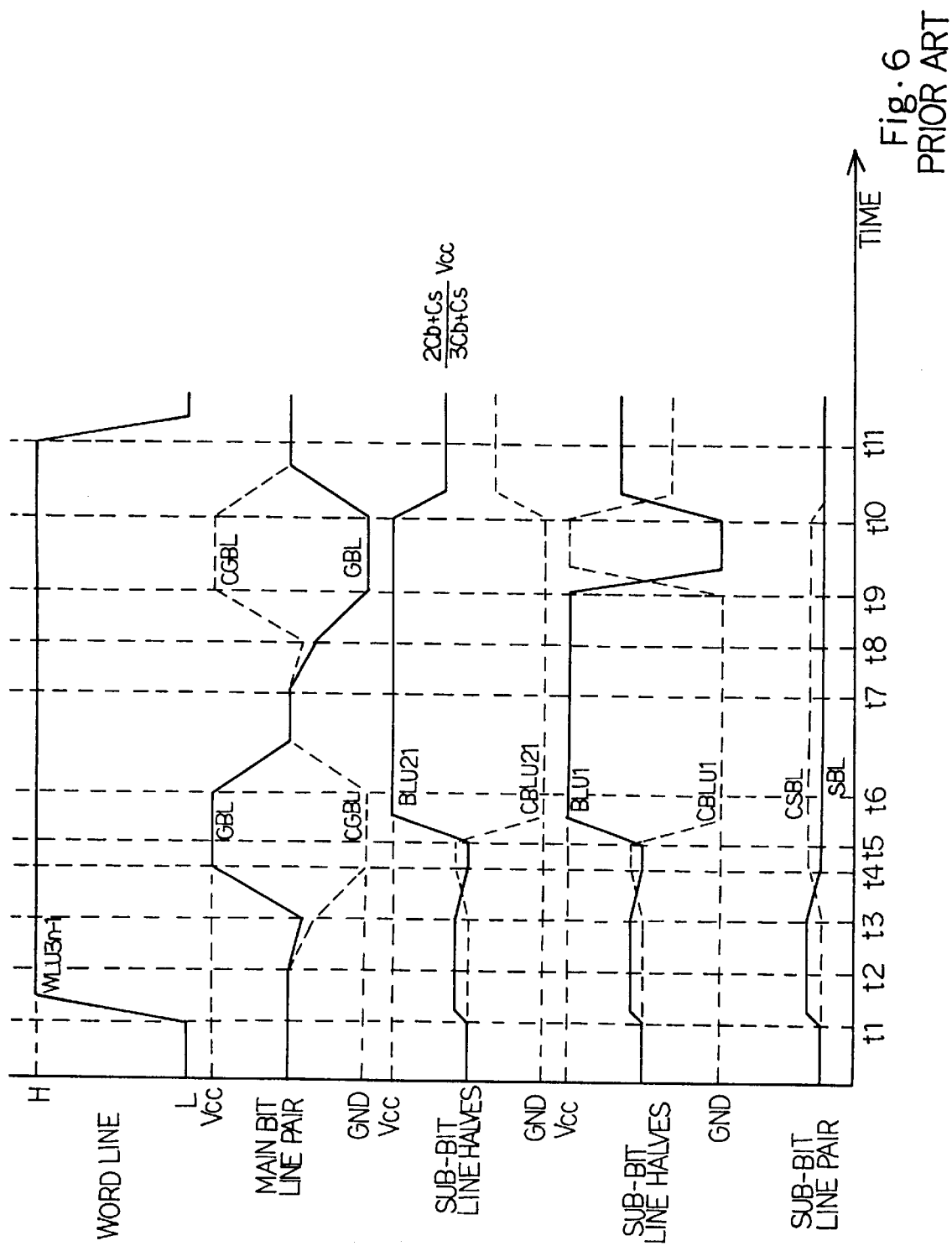
FIG. 6 is a timing chart showing the potential waveforms on the main/sub bit lines incorporated in the semiconductor dynamic random access memory device.

Description is hereinbelow made on differences between the second embodiment and the semiconductor dynamic random access memory device shown in FIG. 4.

Dummy cell arrays 41a/41b/41c are further incorporated in the semiconductor dynamic random access memory device implementing the second embodiment. The dummy cell array 41a has two dummy cells DM11/DM12, and the dummy cells DM11/DM12 are connected between the cell plate line HVCIP and the sub-bit line portions BLU1/CBLU1, respectively. A series combination of an n-channel enhancement type access transistor TR12 and a storage capacitor CP12 form each of the dummy cells DM11/DM12, and dummy word lines DWL1/DWLU2 are connected to the gate electrode of the n-channel enhancement type access transistor TR12 of the dummy cell DM11 and the gate electrode of the n-channel enhancement type access transistor TR12 of the other dummy cell DM12.

The dummy cell array 41b also has two dummy cells DM21/DM22, and the dummy cells DM21/DM22 are connected to the cell plate line HVCIP and the sub-bit line portions BLU21/CBLU21. Dummy word lines DWL3/DWLU4 are connected to the gate electrode of the n-channel enhancement type access transistor TR12 of the dummy cell DM21 and the gate electrode of the n-channel enhancement type access transistor TR12 of the other dummy cell DM22. The dummy cell array 41c has two dummy cells DM31/DM32, and the dummy cells DM31/DM32 are also connected to the cell plate line HVCIP and the sub-bit line portions BLU21/CBLU21. Dummy word lines DWL5/DWLU6 are connected to the gate electrode of the n-channel enhancement type access transistor TR12 of the dummy cell DM31 and the gate electrode of the n-channel enhancement type access transistor TR12 of the other dummy cell DM32. The parasitic capacitance coupled to the sub-bit line portions BLU21/CBLU21 is twice as much as the parasitic capacitance coupled to the sub-bit line portions BLU1/CBLU1 due to the difference in the number of word lines WLU1–WLUn and WLUn+1–WLU3n.

The dummy cells DM11–DM32 are fabricated together with the memory cells MC1a to MC4d, and are equal in dimensions to the memory cells MC1a to MC4d. For this reason, the storage capacitance Cs of each memory cell is equal to that of the dummy cell.

Although the column selector and the data buffer are further incorporated in the semiconductor dynamic random access memory device, they are not shown in FIG. 10.

The memory cell MC1d is assumed to store a piece of multiple-valued data representative of a quaternary value equivalent to binary value "10". Assuming now that the memory cell MC1d is accessed, the semiconductor dynamic random access memory device delivers the piece of multiple-valued data as follows. The bit line pairs BLL/CBLL, BLU/CBLU and SBL/CSBL and the main bit line pair GBL/CGBL have been balanced at the precharge level Vcc/2 before time t0.

Figure 11:
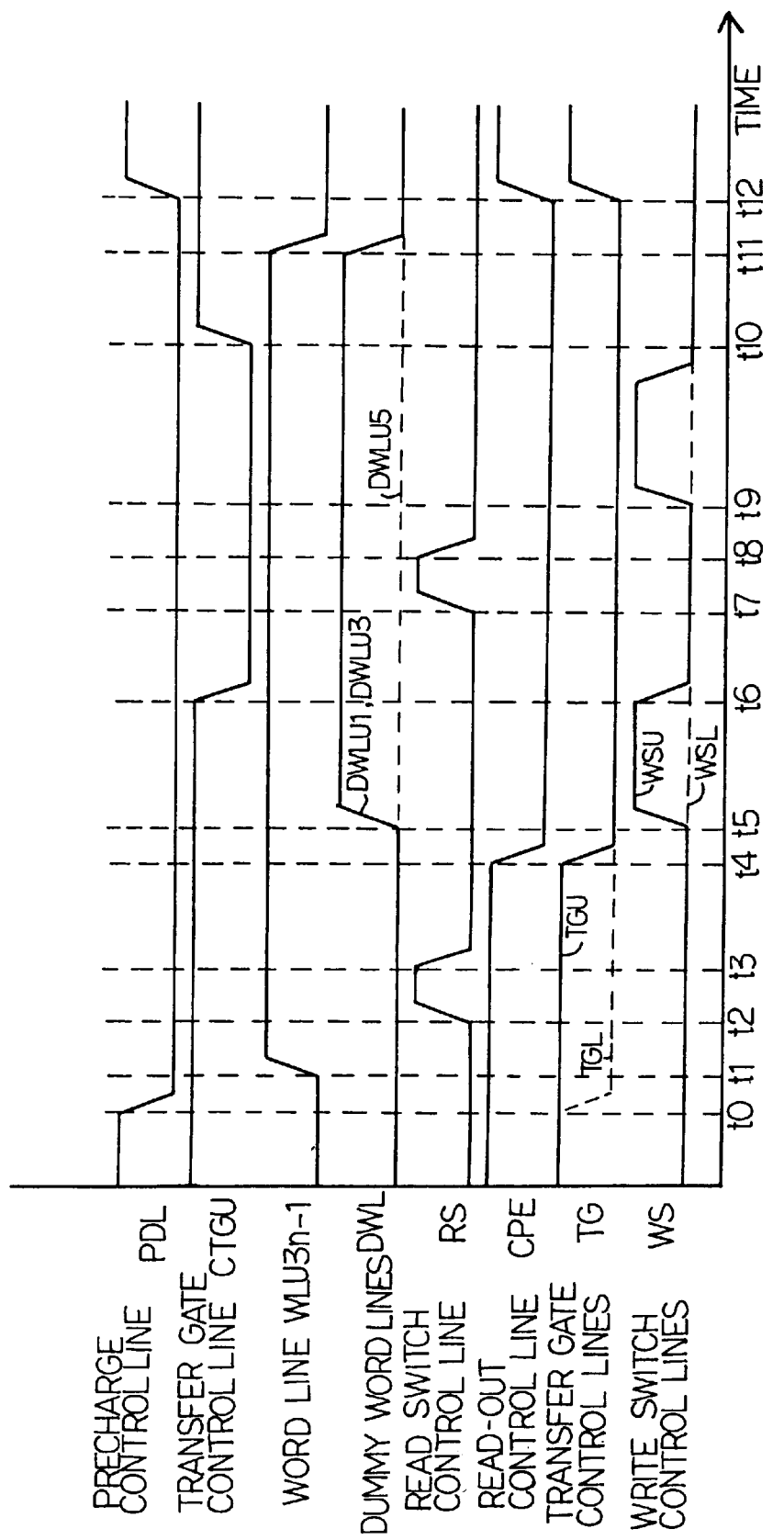
FIG. 11 is a timing chart showing the potential waveforms on control lines incorporated in the semiconductor dynamic random access memory device.

The precharge control line PDL and the transfer gate control line TGL are changed to the inactive low level at time t0 (see FIG. 11). The inactive low level on the precharge control line PDL causes the n-channel enhancement type access transistors SW5 to turn off, and the sub-bit line pair SBL/CSBL is electrically isolated from the potential line HVCD. The inactive low level on the transfer gate control line TGL causes the n-channel enhancement type switching transistors SW2 to turn off, and the transfer gate array 2b disconnects the sub-bit line pair SBL/CSBL from the sub-bit line pair BLL/CBLL. However, the sub-bit line pair SBL/CSBL is still connected to the sub-bit line pair BLU/CBLU, because the transfer gate control lines CTGU/TGU still remain high.

Figure 12:
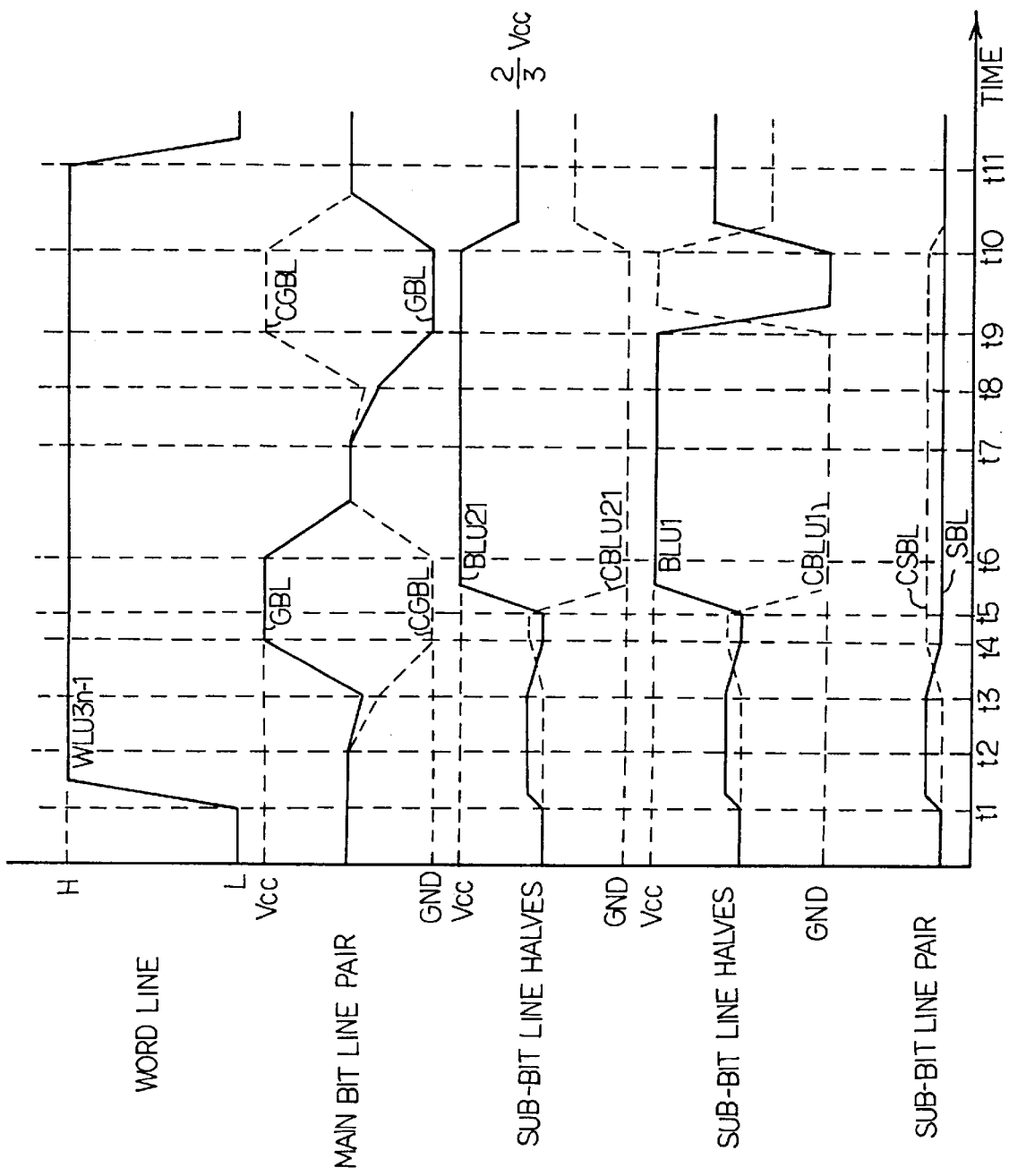
FIG. 12 is a timing chart showing the potential waveforms on main/sub bit lines incorporated in the semiconductor dynamic random access memory device.

The word line WLU3n−1 is changed to the active high level at time t1 (see FIG. 11), and the active high level on the selected word line causes the n-channel enhancement type access transistor TR1 of the memory cell MC1d to turn on so that the storage capacitor CP1 is connected to the associated sub-bit line portion BLU21. Then, the electric charge on the storage node electrode N11 slightly lifts the potential level on the sub-bit line portion BLU21, the sub-bit line portion BLU1 and the sub-bit line SBL (see FIG. 12). Thus, small potential difference is produced on the sub-bit line pairs BLU/CBLU and SBL/CSBL.

The read switch control line RS is changed to the active high level at time t2 (see FIG. 11). Then, the n-channel enhancement type switching transistors SW7/SW9 turn on, and the n-channel enhancement type switching transistors SW10/SW8 transfer the small potential difference from the sub-bit line pair SBL/CSBL to the main bit line pair GBL/CGBL. For this reason, the potential levels on the main bit lines GBL/CGBL are differently decayed from the precharge level (see FIG. 12).

The read switch control line RS is recovered to the inactive low level at time t3 (see FIG. 11), and the sub-sense amplifier 5 stops the differential amplification. The main sense amplifier 8 starts the sense amplification, and increases the magnitude of the potential difference on the main bit line pair GBL/CGBL (see FIG. 12). The large potential difference on the main bit line pair GBL/CGBL is representative of the high order bit of the binary value "10".

The main bit line pair GBL/CGBL is capacitively coupled to the sub-bit line pair SBL/CSBL, and the sense amplification on the main bit line pair GBL/CGBL affects the potential level on the sub-bit line pairs SBL/CSBL and BLU/CBLU. Since the capacitors CP2 change the potential levels on the sub-bit lines SBL/CSBL by ΔV/3, and the potential difference is inverted on the sub-bit line pairs SBL/CSBL and BLU/CBLU.

The read-out switch control line CPE and the transfer gate control line TGU are changed to the inactive low level at time t4 (see FIG. 11). The inactive low level on the transfer gate control line TGU causes the n-channel enhancement type switching transistors SW3 to turn off, and the sub-bit line portions BLU1/CBLU1 and BLU1/CBLU21 are disconnected from the sub-bit line pair SBL/CSBL. The inactive low level on the read-out control line CPE causes the n-channel enhancement type switching transistors SW6 to turn off, and the sub-bit line pair SBL/CSBL is released from the main bit line pair GBL/CGBL.

The write switch control line WSU and the dummy word lines DWLU1/DWLU3 are changed to the active high level at time t5 (see FIG. 11). The active high level on the dummy word lines DWLU1/DWLU3 causes the n-channel enhancement type switching transistors TR12 of the dummy cells DM21/DM11 to connect the storage node electrodes N12/N13 to the associated bit line portion BLU21 and the BLU1, respectively. The active high level on the write switch control line WSU causes the n-channel enhancement type switching transistors SW12 to turn on. Then, the large potential difference is transferred from the main bit line pair GBL/CGBL to the sub-bit line portions BLU1/CBLU1 and the sub-bit line portions BLU21/CBLU21 (see FIG. 12). Thus, the large potential difference representative of the high order bit "1" is propagated to the bit line portions BLU21/CBLU21 and the storage node electrode N12.

The transfer gate control line CTGU and the write switch control line WSU are changed to the inactive low level at time t6 (see FIG. 11). The inactive low level on the write switch control line WSU causes the n-channel enhancement type switching transistors SW12 to turn off, and the sub-bit line pair BLU/CBLU is released from the main bit line pair GBL/CGBL. The inactive low level on the transfer gate control line CTGU causes the n-channel enhancement type switching transistors SW4 to turn off, and the sub-bit line portions BLU21/CBLU21 are disconnected from the sub-bit line portions BLU1/CBLU1. Then, the positive power voltage level Vcc representative of the high order bit "1" is stored on the sub-bit line portion BLU21, the storage node electrode N11 of the memory cell MC1d and the storage node electrode N12 of the dummy cell DM21. The main bit line pair GBL/CGBL is precharged to the precharge level Vcc/2 between time t6 and time t7 (see FIG. 12).

The read switch control line RS is changed to the active high level at time t7, again (see FIG. 11). The sub-sense amplifier 5 is activated, and transfers the small potential difference from the sub-bit line pair SBL/CSBL to the main bit line pair GBL/CGBL (see FIG. 12).

The read switch control line RS is recovered to the inactive low level at time t8 (see FIG. 11), and the sub-sense amplifier 5 stops the differential amplification. The main sense amplifier 8 is activated, and increases the magnitude of the potential difference on the main bit line pair GBL/CGBL (see FIG. 12). The large potential difference on the main bit line pair GBL/CGBL is representative of the low order bit of the binary value "10".

The write switch control line WSU is changed to the active high level at time t9 (see FIG. 11), and the n-channel enhancement type switching transistors SW12 turn on. Then, the large potential difference is transferred from the main bit line pair GBL/CGBL to the sub-bit line portions BLU1/CBLU1 (see FIG. 12). However, the large potential difference is never transferred to the sub-bit line portions BLU21/CBLU21, because the n-channel enhancement type switching transistors SW4 are turned off. The ground level representative of the low order bit is stored on the sub-bit line portion BLU1 and the storage node electrode N13 of the dummy cell DM11.

The write switch control line WSU is recovered to the inactive low level before time t10 (see FIG. 11), and the sub-bit line portions BLU1/CBLU1 are released from the main bit line pair SBL/CSBL.

The transfer gate control line CTGU is changed to the active high level at time t10 (see FIG. 11), and the n-channel enhancement type switching transistors SW4 turn on so as to connect the sub-bit line portions BLU1/CBLU1 to the sub-bit line portions BLU21/CBLU21. Then, the potential level Vn11 on the storage node electrode N11 is given by equation 5.

$$Vn11 = \{(2Cb + 2Cs) \cdot Vcc + (Cb + Cs) \cdot 0[V]\} / (3Cb + 3Cs)$$
$$= 2Vcc/3 \qquad \text{Equation 5}$$

As will be understood from equation 5, the restore level Vn11 is free from the storage capacitance Cs, and the second embodiment achieves the advantage of the first embodiment.

Figure 13:
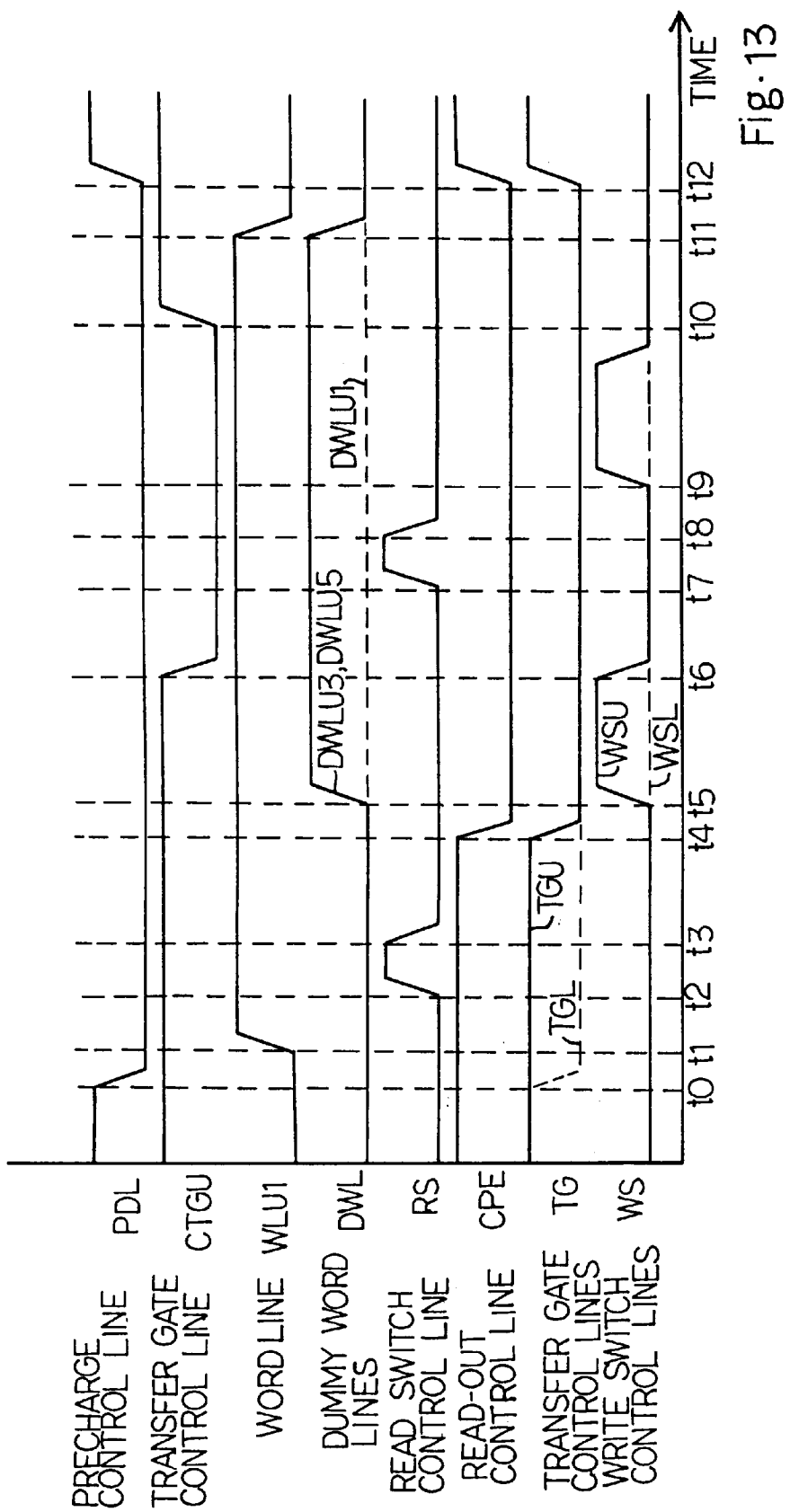
FIG. 13 is a timing chart showing the potential waveforms on the control lines during access to another memory cell.

When the memory cell MC3c is accessed, the control lines and the main/sub-bit line pairs are changed as shown in FIGS. 13 and 14. The memory cell MC3c is assumed to store a piece of multiple-valued data representative of a quaternary value corresponding to the binary value "10". The bit line pairs BLL/CBLL, BLU/CBLU and SBL/CSBL and the main bit line pair GBL/CGBL have been balanced at the precharge level Vcc/2 before time t0.

The precharge control line PDL and the transfer gate control line TGL are changed to the inactive low level at time t0 (see FIG. 11). The inactive low level on the precharge control line PDL causes the n-channel enhancement type access transistors SW5 to turn off, and the sub-bit line pair SBL/CSBL is electrically isolated from the potential line HVCD. The inactive low level on the transfer gate control line TGL causes the n-channel enhancement type switching transistors SW2 to turn off, and the transfer gate array 2b disconnects the sub-bit line pair SBL/CSBL from the sub-bit line pair BLL/CBLL. However, the sub-bit line pair SBL/CSBL is still connected to the sub-bit line pair BLU/CBLU, because the transfer gate control lines CTGU/TGU still remain high.

The word line WLU1 is changed to the active high level at time t1 (see FIG. 13), and the active high level on the selected word line causes the n-channel enhancement type access transistor TR1 of the memory cell MC3c to turn on so that the storage capacitor CP1 is connected to the associated sub-bit line portion BLU1. Then, the electric charge on the storage node electrode N14 slightly lifts the potential level on the sub-bit line portion BLU1, the sub-bit line portion BLU21 and the sub-bit line SBL (see FIG. 14). Thus, small potential difference is produced on the sub-bit line pairs BLU/CBLU and SBL/CSBL.

The read switch control line RS is changed to the active high level at time t2 (see FIG. 13). Then, the n-channel enhancement type switching transistors SW7/SW9 turn on, and the n-channel enhancement type switching transistors SW10/SW8 transfer the small potential difference from the sub-bit line pair SBL/CSBL to the main bit line pair GBL/CGBL. For this reason, the potential levels on the main bit lines GBL/CGBL are differently decayed from the precharge level (see FIG. 14).

The read switch control line RS is recovered to the inactive low level at time t3 (see FIG. 13), and the sub-sense amplifier 5 stops the differential amplification. The main sense amplifier 8 starts the sense amplification, and increases the magnitude of the potential difference on the main bit line pair GBL/CGBL (see FIG. 14). The large potential difference on the main bit line pair GBL/CGBL is representative of the high order bit of the binary value "10".

The main bit line pair GBL/CGBL is capacitively coupled to the sub-bit line pair SBL/CSBL, and the sense amplification on the main bit line pair GBL/CGBL affects the potential level on the sub-bit line pairs SBL/CSBL and BLU/CBLU. Since the capacitors CP2 change the potential levels on the sub-bit lines SBL/CSBL by ΔV/3, and the potential difference is inverted on the sub-bit line pairs SBL/CSBL and BLU/CBLU.

The read-out switch control line CPE and the transfer gate control line TGU are changed to the inactive low level at time t4 (see FIG. 13). The inactive low level on the transfer gate control line TGU causes the n-channel enhancement type switching transistors SW3 to turn off, and the sub-bit line portions BLU1/CBLU1 and BLU1/CBLU21 are disconnected from the sub-bit line pair SBL/CSBL. The inactive low level on the read-out control line CPE causes the n-channel enhancement type switching transistors SW6 to turn off, and the sub-bit line pair SBL/CSBL is released from the main bit line pair GBL/CGBL.

The write switch control line WSU and the dummy word lines DWLU3/DWLU5 are changed to the active high level at time t5 (see FIG. 13). The active high level on the dummy word lines DWLU3/DWLU5 causes the n-channel enhancement type switching transistors TR12 of the dummy cells DM21/DM31 to connect the storage node electrodes N12/N15 to the associated bit line portion BLU21. The active high level on the write switch control line WSU causes the n-channel enhancement type switching transistors SW12 to turn on. Then, the large potential difference is transferred from the main bit line pair GBL/CGBL to the sub-bit line portions BLU1/CBLU1 and the sub-bit line portions BLU21/CBLU21 (see FIG. 14). Thus, the large potential difference representative of the high order bit "1" is propagated to the bit line portions BLU21/CBLU21 and the storage node electrodes N12/N15.

The transfer gate control line CTGU and the write switch control line WSU are changed to the inactive low level at time t6 (see FIG. 13). The inactive low level on the write switch control line WSU causes the n-channel enhancement type switching transistors SW12 to turn off, and the sub-bit line pair BLU/CBLU is released from the main bit line pair GBL/CGBL. The inactive low level on the transfer gate control line CTGU causes the n-channel enhancement type switching transistors SW4 to turn off, and the sub-bit line portions BLU21/CBLU21 are disconnected from the sub-bit line portions BLU1/CBLU1. Then, the positive power voltage level Vcc representative of the high order bit "1" is stored on the sub-bit line portion BLU21 and the storage node electrodes N12/N15 of the dummy cells DM21/DM31. The main bit line pair GBL/CGBL is precharged to the precharge level Vcc/2 between time t6 and time t7 (see FIG. 14).

The read switch control line RS is changed to the active high level at time t7, again (see FIG. 13). The sub-sense amplifier 5 is activated, and transfers the small potential difference from the sub-bit line pair SBL/CSBL to the main bit line pair GBL/CGBL (see FIG. 14).

The read switch control line RS is recovered to the inactive low level at time t8 (see FIG. 13), and the sub-sense amplifier 5 stops the differential amplification. The main sense amplifier 8 is activated, and increases the magnitude of the potential difference on the main bit line pair GBL/CGBL (see FIG. 14). The large potential difference on the main bit line pair GBL/CGBL is representative of the low order bit of the binary value "10".

The write switch control line WSU is changed to the active high level at time t9 (see FIG. 13), and the n-channel enhancement type switching transistors SW12 turn on. Then, the large potential difference is transferred from the main bit line pair GBL/CGBL to the sub-bit line portions BLU1/CBLU1 (see FIG. 14). However, the large potential difference is never transferred to the sub-bit line portions BLU21/CBLU21, because the n-channel enhancement type switching transistors SW4 are turned off. The ground level representative of the low order bit is stored on the sub-bit line portion BLU1 and the storage node electrode N14 of the memory cell MC3c.

The write switch control line WSU is recovered to the inactive low level before time t10 (see FIG. 13), and the sub-bit line portions BLU1/CBLU1 are released from the main bit line pair SBL/CSBL.

The transfer gate control line CTGU is changed to the active high level at time t10 (see FIG. 13), and the n-channel enhancement type switching transistors SW4 turn on so as to connect the sub-bit line portions BLU1/CBLU1 to the sub-bit line portions BLLU21/CBLU21. Then, the potential level Vn14 on the storage node electrode N14 is given as similar to the restore level Vn11.

As will be appreciated from the foregoing description, the dummy cells make the ratio of storage capacitance Cs between the bit line portion assigned to the high order bit and the other bit line portion assigned to the low order bit equal to the ratio of parasitic capacitance Cb between the bit line portion assigned to the high order bit and the other bit line portion assigned to the low order bit, and eliminate the influence of the storage capacitance Cs from the restore level. For this reason, even if the manufacturer increases the storage capacitance of each memory cell, the piece of multiple-valued data is never destroyed, and the memory cells reliably store the pieces of multiple-valued data.

Although particular embodiments of the present invention have been shown and described, it will be apparent to those skilled in the art that various changes and modifications may be made without departing from the spirit and scope of the present invention.

For example, the present invention is applicable to a semiconductor dynamic random access memory device for storing pieces of multiple-valued representative of more than 2 binary bits. The dummy cell may have the storage capacitance multiplied by an appropriate natural number.

A semiconductor dynamic random access memory device may successively store data bits from the least significant bit to the most significant bit before producing a restore level.

When the number of memory cells is increased, the memory cells may be associated with more than one sub-sense amplifier. In this instance, the main sense amplifier 38 is shared between the sub-sense amplifiers.

What is claimed is:

1. A semiconductor memory device for storing multiple-valued data equivalent to more than one bit binary data, comprising:

a plurality of memory cells each storing said multiple-valued data in a storage capacitor having a storage capacitance;

a plurality of sub-bit line pairs selectively connected to said plurality of memory cells;

at least one main bit line pair coupled to said plurality of sub-bit line pairs;

an addressing system rendering said plurality of memory cells selectively accessible, and causing a selected one of said plurality of memory cells to produce a first potential difference on one of said plurality of sub-bit line pairs connected to said selected one of said plurality of memory cells;

a plurality of transfer gate circuits inserted between said plurality of sub-bit line pairs, and selectively connecting said plurality of sub-bit line pairs to one another so as to define a plurality of charge accumulators having respective capacitances weighted by two in said plurality of sub-bit line pairs;

a first data transfer circuit connected between another of said plurality of sub-bit line pairs and said at least one main bit line pair, and responsive to said first potential difference and a second potential difference propagated to said another of said plurality of sub-bit line pairs for producing a third potential difference and a fourth potential difference on said at least one main bit line pair;

a main sense amplifier connected to said at least one main bit line pair, and increasing a magnitude of said third potential difference and the magnitude of said fourth potential difference so as to produce a first large potential difference representative of the most significant bit of more than one bit binary data equivalent to said multiple-valued data and a second large potential difference representative of the least significant bit of said more than one bit binary data on said at least one main bit line pair;

a potential difference generator responsive to said first large potential difference and said second large potential difference on said at least one main bit line pair so as to produce a fifth potential difference and said second potential difference propagated to said another of said plurality of sub-bit line pairs;

a plurality of second data transfer circuits connected between said at least one main bit line pair and said plurality of charge accumulators, and producing a third large potential difference and a fourth large potential difference on said plurality of charge accumulators for storing a first electric charge representative of said most significant bit and a second electric charge representative of said least significant bit in said plurality of charge accumulators, respectively;

a plurality of dummy cells selectively connected to said plurality of charge accumulators, and having respective storage capacitances so that total storage capacitances respectively coupled to said plurality of charge accumulators are weighted by two.

2. The semiconductor memory device as set forth in claim 1, in which each of said plurality of memory cells has a first switching transistor and a first storage capacitor connected in series to said first switching transistor, and each of said plurality of dummy cells has a second switching transistor and a second storage capacitor equal in dimension to said first storage capacitor and connected in series to said second switching transistor.

3. The semiconductor memory device as set forth in claim 1, in which said plurality of memory cells form a first memory cell array connected to a first sub-bit line pair of said plurality of sub-bit line pairs, a second memory cell array connected to a second sub-bit line pair of said plurality of sub-bit line pairs, a third memory cell array connected to a third sub-bit line pair of said plurality of sub-bit line pairs and a fourth memory cell array connected to a fourth sub-bit line pair of said plurality of sub-bit line pairs, and said plurality of transfer gate circuits are connected between said first sub-bit line pair, said second sub-bit line pair, said third sub-bit line pair, said fourth sub-bit line pair and a fifth sub-bit line pair of said plurality of sub-bit line pairs located between said second sub-bit line pair and said third sub-bit line pair so as to form one of said plurality of charge accumulators assigned to said most significant bit and another of said plurality of charge accumulators assigned to said least significant bit from said third sub-bit line pairs and said second sub-bit line pair, respectively, when said one of said plurality of memory cells is incorporated in one of said third and fourth memory cell arrays.

4. The semiconductor memory device as set forth in claim 3, in which said one of said plurality of charge accumulators is twice as much in capacitance as said another of said plurality of charge accumulators, a pair of first dummy cells of said plurality of dummy cells and a pair of second dummy cells equal in storage capacitance to said pair of said first dummy cells are respectively connected to said first and second sub-bit line pairs and said third and fourth sub-bit line pairs, and the storage capacitance of said pair of first dummy cells and the storage capacitance of said pair of second dummy cells are respectively coupled to said one of said plurality of charge accumulators and said another of said plurality of charge accumulators when said one of said plurality of memory cells is selected from said third and fourth memory cell arrays.

5. The semiconductor memory device as set forth in claim 4, in which each of said plurality of memory cells has a first switching transistor and a first storage capacitor connected in series to said first switching transistor, and each of said plurality of dummy cells has a second switching transistor and a second storage capacitor equal in dimension to said first storage capacitor and connected in series to said second switching transistor.

6. The semiconductor memory device as set forth in claim 3, in which said first data transfer circuit has a series combination of a first activation transistor and a first discharging transistor connected between one of the main bit lines of said main bit line pair and a constant potential line and a second series combination of a second activation transistor and a second discharging transistor connected between the other of said main bit lines and said constant potential line, and a potential level on one of the sub-bit lines of said fifth sub-bit line pair and a potential level on the other of said sub-bit lines of said fifth sub-bit line pair determine a channel conductance of said first discharging transistor and a channel conductance of said second discharging transistor after said first activation transistor and said second activation transistor concurrently turn on.

7. The semiconductor memory device as set forth in claim 3, in which said potential difference generator has a series of a first switching transistor and a first coupling capacitor connected between one of the main bit lines of said main bit line pair and one of the sub-bit lines of said fifth sub-bit line pair and a series of a second switching transistor and a second coupling capacitor connected between the other of said main bit lines and the other of said sub-bit lines, and said first coupling capacitor and said second coupling capacitor generate one of said fifth potential difference and said second potential difference after said first switching transistor and said second switching transistor concurrently turn on.

8. The semiconductor memory device as set forth in claim 3, in which one of said plurality of second data transfer circuits has first switching transistors respectively connected between the main bit lines of said main bit line pair and the sub-bit lines of said third sub-bit line pair, and another of said plurality of second data transfer circuits has second switching transistors respectively connected between said main bit lines and the sub-bit lines of said second sub-bit line pair.

9. The semiconductor memory device as set forth in claim 1, in which said plurality of memory cells form at least a first memory cell array connected to a first sub-bit line pair of said plurality of sub-bit line pairs and a second memory cell array connected to a second sub-bit line pair of said plurality of sub-bit line pairs, and said plurality of transfer gate circuits are connected between said first sub-bit line pair, said second sub-bit line pair and a third sub-bit line pair of said plurality of sub-bit line pairs so as to form one of said plurality of charge accumulators assigned to said most significant bit and another of said plurality of charge accumulators assigned to said least significant bit from said second sub-bit line pair and said first sub-bit line pair, respectively, when said one of said plurality of memory cells is incorporated in one of said first and second memory cell arrays.

10. The semiconductor memory device as set forth in claim 9, in which said one of said plurality of charge accumulators is twice as much in capacitance as said another of said plurality of charge accumulators, and said plurality of dummy cells has two pairs of first dummy cells selectively coupled to said second sub-bit line pair and a pair of second dummy cells coupled to said first sub-bit line pair and equal in storage capacitance to each of said two pairs of first dummy cells.

11. The semiconductor memory device as set forth in claim 10, in which one of said two pairs of first dummy cells and said pair of second dummy cells are respectively coupled to said second sub-bit line pair and said first sub-bit line pair when said one of said plurality of memory cells is selected from said second memory cell arrays.

12. The semiconductor memory device as set forth in claim 10, in which both of said two pairs of first dummy cells are coupled to said second sub-bit line pair and said pair of second dummy cells is disconnected from said first sub-bit line pair when said one of said plurality of memory cells is selected from said first memory cell array.

13. The semiconductor memory device as set forth in claim 10, in which each of said plurality of memory cells has a first switching transistor and a first storage capacitor connected in series to said first switching transistor, and each of said plurality of dummy cells has a second switching transistor and a second storage capacitor equal in dimension to said first storage capacitor and connected in series to said second switching transistor.

14. The semiconductor memory device as set forth in claim 9, in which said first data transfer circuit has a series combination of a first activation transistor and a first discharging transistor connected between one of the main bit lines of said main bit line pair and a constant potential line and a second series combination of a second activation transistor and a second discharging transistor connected between the other of said main bit lines and said constant potential line, and a potential level on one of the sub-bit lines of said third sub-bit line pair and a potential level on the other of said sub-bit lines of said third sub-bit line pair determine a channel conductance of said first discharging transistor and a channel conductance of said second discharging transistor after said first activation transistor and said second activation transistor concurrently turn on.

15. The semiconductor memory device as set forth in claim 9, in which said potential difference generator has a series of a first switching transistor and a first coupling capacitor connected between one of the main bit lines of said main bit line pair and one of the sub-bit lines of said third sub-bit line pair and a series of a second switching transistor and a second coupling capacitor connected between the other of said main bit lines and the other of said sub-bit lines, and said first coupling capacitor and said second coupling capacitor generate one of said fifth potential difference and said second potential difference after said first switching transistor and said second switching transistor concurrently turn on.

16. The semiconductor memory device as set forth in claim 9, in which one of said plurality of second data transfer circuits has first switching transistors respectively connected between the main bit lines of said main bit line pair and the sub-bit lines of said first sub-bit line pair.

* * * * *